US010388220B2

(12) United States Patent
Chung et al.

(10) Patent No.: US 10,388,220 B2
(45) Date of Patent: Aug. 20, 2019

(54) PIXEL AND ORGANIC LIGHT EMITTING DISPLAY DEVICE USING THE SAME

(71) Applicant: Samsung Display Co., Ltd., Yongin-si (KR)

(72) Inventors: Bo Yong Chung, Yongin-si (KR); Jun Hyun Park, Yongin-si (KR); Young Wan Seo, Yongin-si (KR); An Su Lee, Yongin-si (KR); Kang Moon Jo, Yongin-si (KR); Chong Chul Chai, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 154 days.

(21) Appl. No.: 15/698,420

(22) Filed: Sep. 7, 2017

(65) Prior Publication Data

US 2018/0204510 A1   Jul. 19, 2018

(30) Foreign Application Priority Data

Jan. 17, 2017   (KR) .................. 10-2017-0008251

(51) Int. Cl.
*G09G 3/3233* (2016.01)
*H01L 51/52* (2006.01)

(52) U.S. Cl.
CPC ....... *G09G 3/3233* (2013.01); *H01L 51/5206* (2013.01); *H01L 51/5296* (2013.01);
(Continued)

(58) Field of Classification Search
CPC ... G09G 2300/0417; G09G 2300/0439; G09G 2300/0819; G09G 2300/0852;
(Continued)

(56) References Cited

U.S. PATENT DOCUMENTS

2006/0044244 A1   3/2006 Numao
2007/0085847 A1*  4/2007 Shishido .............. G09G 3/3233
                                              345/204
(Continued)

FOREIGN PATENT DOCUMENTS

KR   10-2016-0042284   4/2016
WO      2009/117092   9/2009

OTHER PUBLICATIONS

Extended European Search Report dated Apr. 5, 2018, in European Patent Application No. 18151515.6.

(Continued)

*Primary Examiner* — Afroza Chowdhury
(74) *Attorney, Agent, or Firm* — H.C. Park & Associates, PLC

(57) ABSTRACT

A pixel including an organic light emitting diode; a first transistor for controlling the amount of current flowing from a first driving power source to a second driving power source via the organic light emitting diode, corresponding to a voltage of a first node; a second transistor coupled between the first node and a second node, the second transistor being turned on when a scan signal is supplied to an ith (i is a natural number) scan line; a third transistor coupled between the second node and an anode electrode of the organic light emitting diode; a first capacitor coupled between a data line and the second node; and a fourth transistor coupled between an initialization power source and the anode electrode of the organic light emitting diode. The fourth transistor is turned on in response to a first control signal being supplied to a first control line.

31 Claims, 36 Drawing Sheets

(52) U.S. Cl.
    CPC ............... *G09G 2300/0417* (2013.01); *G09G 2300/0439* (2013.01); *G09G 2300/0819* (2013.01); *G09G 2300/0852* (2013.01); *G09G 2300/0866* (2013.01); *G09G 2310/0251* (2013.01); *G09G 2320/043* (2013.01)

(58) Field of Classification Search
    CPC ... G09G 2300/0866; G09G 2310/0251; G09G 2320/043; G09G 3/3233; H01L 51/5206; H01L 51/5296
    See application file for complete search history.

(56)            References Cited

U.S. PATENT DOCUMENTS

2013/0222356 A1    8/2013    Jeong et al.
2016/0104429 A1    4/2016    Kang

OTHER PUBLICATIONS

Mativenga et al., "Oxide Versus LTPS TFTs for Active-Matrix Displays," Jun. 30, 2014, pp. 1-4, available at http://onlinelibrary.wiley.com/doi/10.1002/j.2168-0159.2014.tb00001.x/pdf.

* cited by examiner

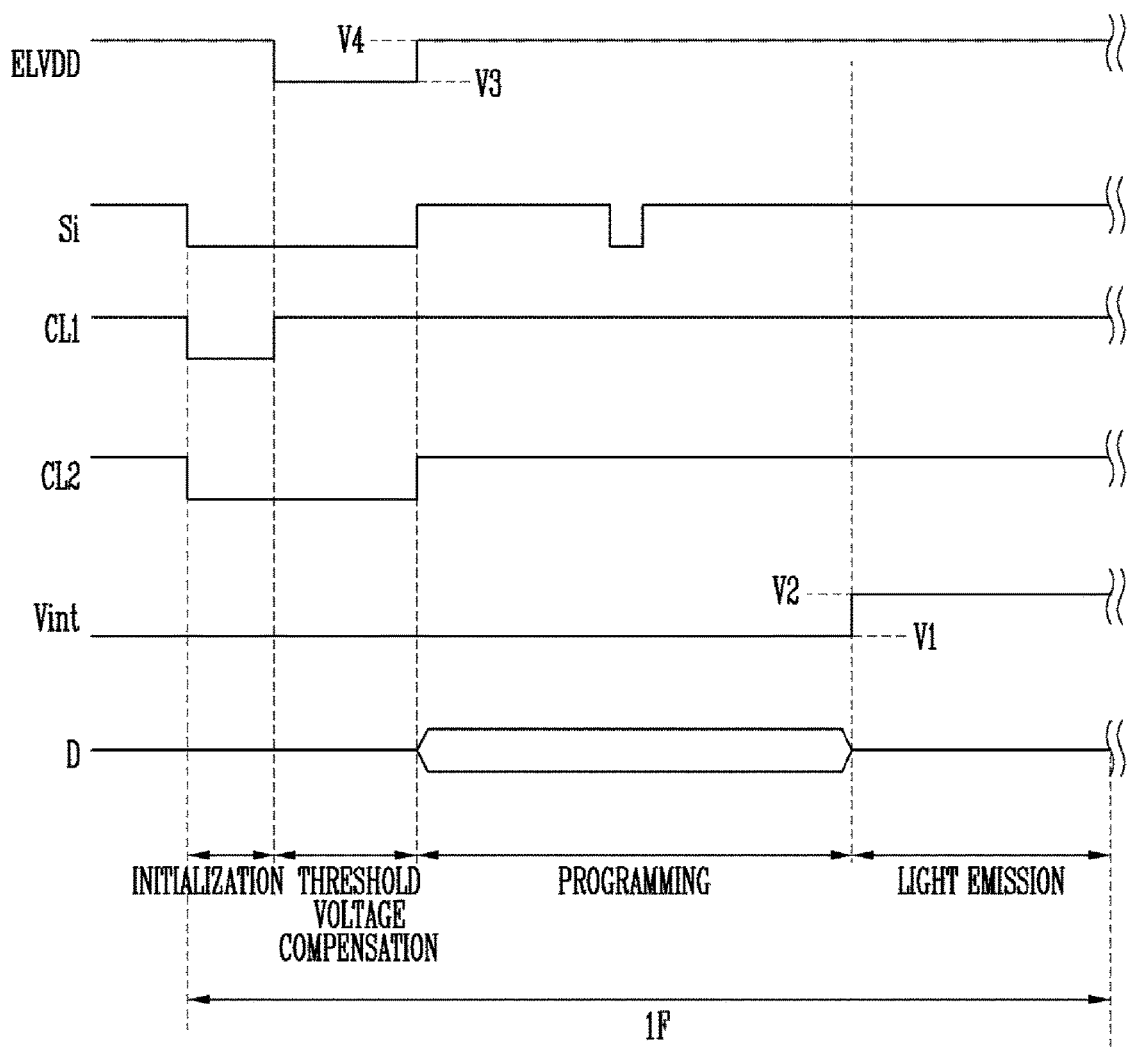

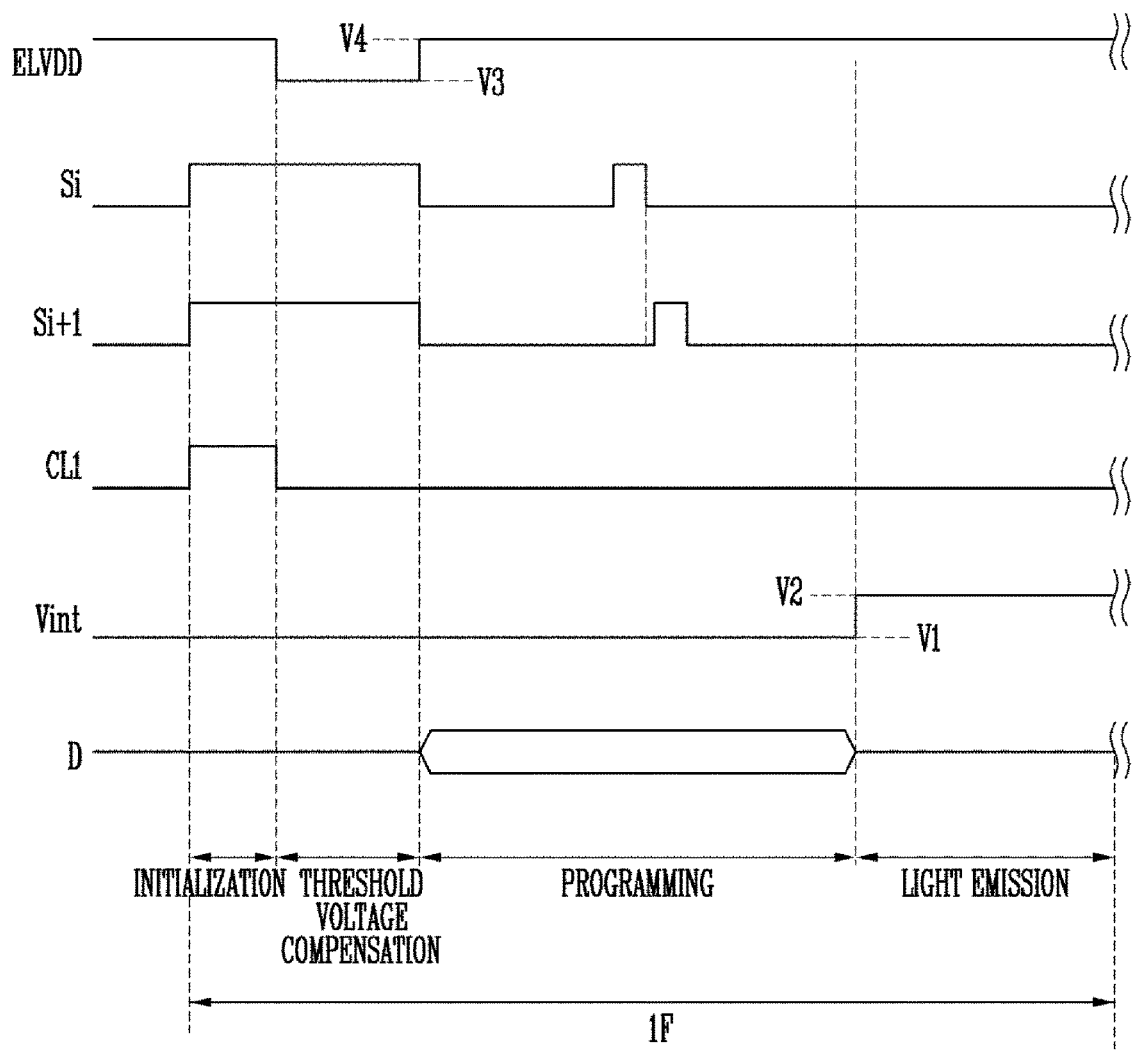

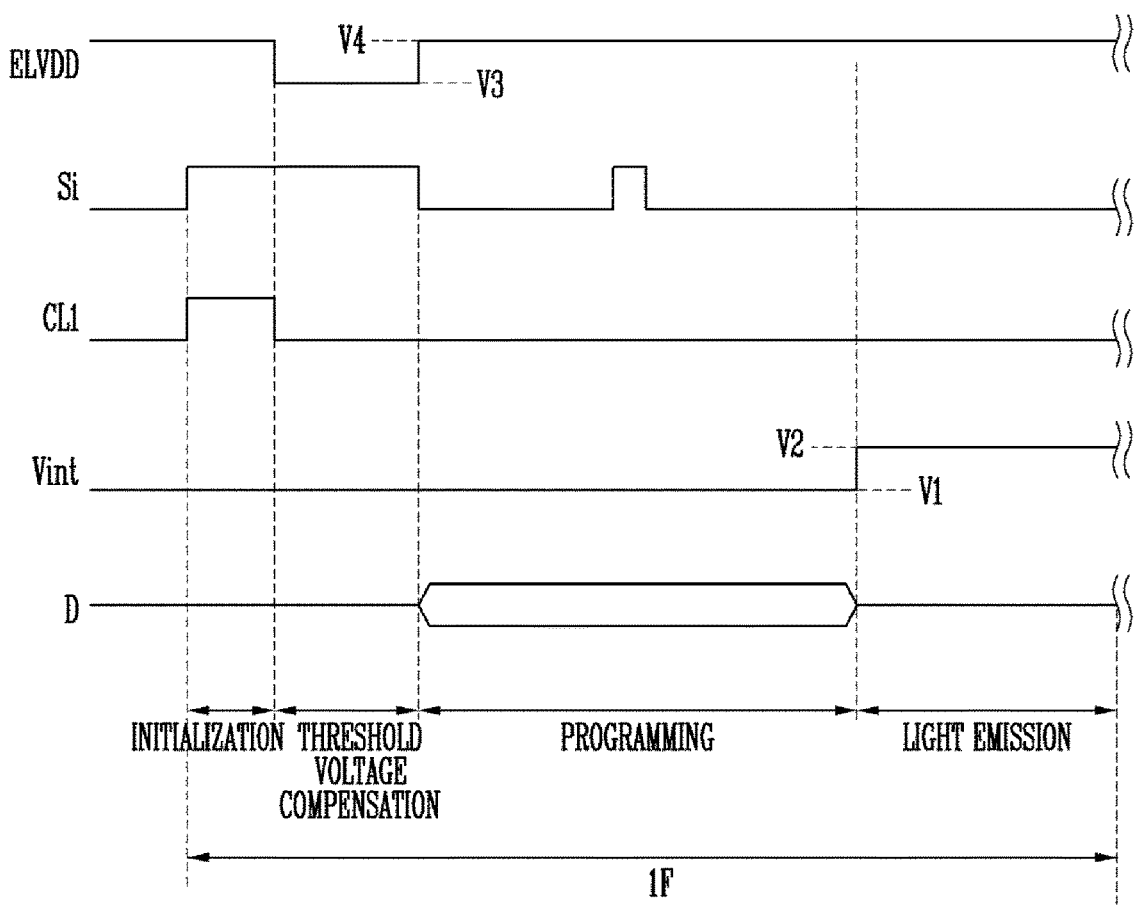

PIXEL AND ORGANIC LIGHT EMITTING DISPLAY DEVICE USING THE SAME

CROSS-REFERENCE TO RELATED APPLICATION

This application claims priority from and the benefit of Korean Patent Application No. 10-2017-0008251, filed on Jan. 17, 2017, which is hereby incorporated by reference for all purposes as if fully set forth herein.

BACKGROUND

Field

Exemplary embodiments relate to a pixel and an organic light emitting display device using the same. More particularly, exemplary embodiments relate to a pixel capable of improving display quality and an organic light emitting display device using the pixel.

Discussion of the Background

With the constant development of information technologies, the importance of a display device, which is a connection medium between a user and information, increases. Accordingly, display devices, such as a liquid crystal display device and an organic light emitting display device, are increasingly being used.

Among these display devices, the organic light emitting display device displays images using an organic light emitting diode that generates light by recombination of electrons and holes. The organic light emitting display device has a high response speed and is driven with low power consumption.

The organic light emitting display device includes pixels coupled to data lines and scan lines. Each of the pixels generally includes an organic light emitting diode and a driving transistor for controlling an amount of current flowing through the organic light emitting diode. Each of the pixels generates light with a predetermined luminance while supplying current from the driving transistor to the organic light emitting diode, corresponding to a data signal.

The pixel may include a plurality of transistors, e.g., six or more, transistors and a plurality of capacitors so as to compensate for a variation in threshold voltage of the driving transistor. When the plurality of transistors are included in the pixel, it is difficult to apply the pixel to a high-resolution panel. Thus, there is need for a pixel capable of improving display quality while minimizing the number of transistors included therein.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a pixel capable of improving display quality while minimizing the number of transistors included therein and an organic light emitting display device using the pixel.

Additional aspects will be set forth in the detailed description which follows, and, in part, will be apparent from the disclosure, or may be learned by practice of the inventive concept.

According to exemplary embodiments, there is provided a pixel including: an organic light emitting diode; a first transistor for controlling the amount of current flowing from a first driving power source to a second driving power source via the organic light emitting diode, corresponding to a voltage of a first node; a second transistor coupled between the first node and a second node, the second transistor being turned on when a scan signal is supplied to an ith (i is a natural number) scan line; a third transistor coupled between the second node and an anode electrode of the organic light emitting diode; a first capacitor coupled between a data line and the second node; and a fourth transistor coupled between an initialization power source and the anode electrode of the organic light emitting diode, the fourth transistor being turned on when a first control signal is supplied to a first control line.

The pixel may further include a storage capacitor coupled between the first node and the initialization power source.

A turn-on period of the fourth transistor may at least partially overlap with that of the second transistor.

The third transistor may be turned on when a second control signal is supplied to a second control line, and a turn-on period of the third transistor may at least partially overlap with that of the second transistor.

The third transistor may be turned on when a scan signal is supplied to an (i+1)th scan line.

The third transistor the third transistor may be turned on when the scan signal is supplied to the ith scan line.

The first transistor may be an N-type transistor.

The second to fourth transistors may be N-type transistors.

At least one of the first to fourth transistors may be a poly-silicon semiconductor transistor.

At least one of the first to fourth transistors may be an oxide semiconductor transistor.

At least one of the second to fourth transistors may be a P-type transistor.

According to another aspect of the inventive concept, there is provided a pixel including: an organic light emitting diode; a first transistor for controlling the amount of current flowing from a first driving power source to a second driving power source via the organic light emitting diode, corresponding to a voltage of a first node; a second transistor coupled between the first node and an anode electrode of the organic light emitting diode, the second transistor being turned on when a scan signal is supplied to an ith scan line; a third transistor coupled between the anode electrode of the organic light emitting diode and a first terminal of a first capacitor, the third transistor being turned on when the scan signal is supplied to the ith scan line; the first capacitor coupled between the third transistor and a data line; and a fourth transistor coupled between an initialization power source and the anode electrode of the organic light emitting diode, the fourth transistor being turned on when a first control signal is supplied to a first control line.

The pixel may further include a storage capacitor coupled between the first node and the initialization power source.

A turn-on period of the fourth transistor may at least partially overlap with that of the second transistor.

According to still another aspect of the inventive concept, there is provided an organic light emitting display device driven during one frame period divided into an initialization period, a threshold voltage compensation period, a programming period, and a light emission period, the organic light emitting display device including: pixels located to be coupled to scan lines and data lines; a scan driver for supplying a scan signal to the scan lines; a control driver for supplying a first control signal to a first control line commonly coupled to the pixels; and a power supply unit for supplying, to the pixels, a first driving power source, a second driving power source, and an initialization power source, wherein a pixel located on an ith (i is a natural number) horizontal line includes: an organic light emitting diode; a first transistor for controlling the amount of current flowing from the first driving power source to the second driving power source via the organic light emitting diode, corresponding to a voltage of a first node; a second transistor coupled between the first node and a second node, the second transistor being turned on when a scan signal is supplied to an ith scan line; a third transistor coupled between the second node and an anode electrode of the organic light emitting diode; a first capacitor coupled between a data line and the second node; and a fourth transistor coupled between the initialization power source and the anode electrode of the organic light emitting diode, the fourth transistor being turned on when the first control signal is supplied to the first control line.

The control driver may supply the first control signal during the initialization period.

The scan driver may simultaneously supply the scan signal to the scan lines during the initialization period and the threshold voltage compensation period, and sequentially supply the scan signal to the scan lines during the programming period.

The power supply unit may supply the initialization power source having a first voltage during the initialization period, the threshold voltage compensation period, and the programming period, and supply the initialization power source having a second voltage higher than the first voltage during the light emission period.

The first voltage may be set such that the organic light emitting diode does not emit light.

The power supply unit may supply the first driving power source having a third voltage during the threshold voltage compensation period, and supply the first driving power source having a fourth voltage higher than the third voltage during the other periods.

The first voltage may be set to a voltage higher than the third voltage.

The pixel located on the ith horizontal line may further include a storage capacitor coupled between the first node and the initialization power source.

The organic light emitting display device may further include a second control line commonly coupled to the pixels. The control driver may supply a second control signal to the second control line during the initialization period and the threshold voltage compensation period.

The third transistor may be turned on when the second control signal is supplied.

The third transistor may be turned on when a scan signal is supplied to an (i+1)th scan line.

The third transistor may be turned on when the scan signal is supplied to the ith scan line.

The first transistor may be an N-type transistor.

The second to fourth transistors may be N-type transistors.

At least one of the first to fourth transistors may be a poly-silicon semiconductor transistor.

At least one of the first to fourth transistors may be an oxide semiconductor transistor.

At least one of the second to fourth transistors may be a P-type transistor.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

FIG. 9 is a waveform diagram illustrating an exemplary embodiment of a driving method of the pixel shown in FIG. 8.

FIG. 14 is a waveform diagram illustrating an exemplary embodiment of a driving method of the pixel shown in FIG. 13.

FIG. 19 is a waveform diagram illustrating an exemplary embodiment of a driving method of the pixel shown in FIG. 18.

DETAILED DESCRIPTION OF THE ILLUSTRATED EMBODIMENTS

Figure 1:
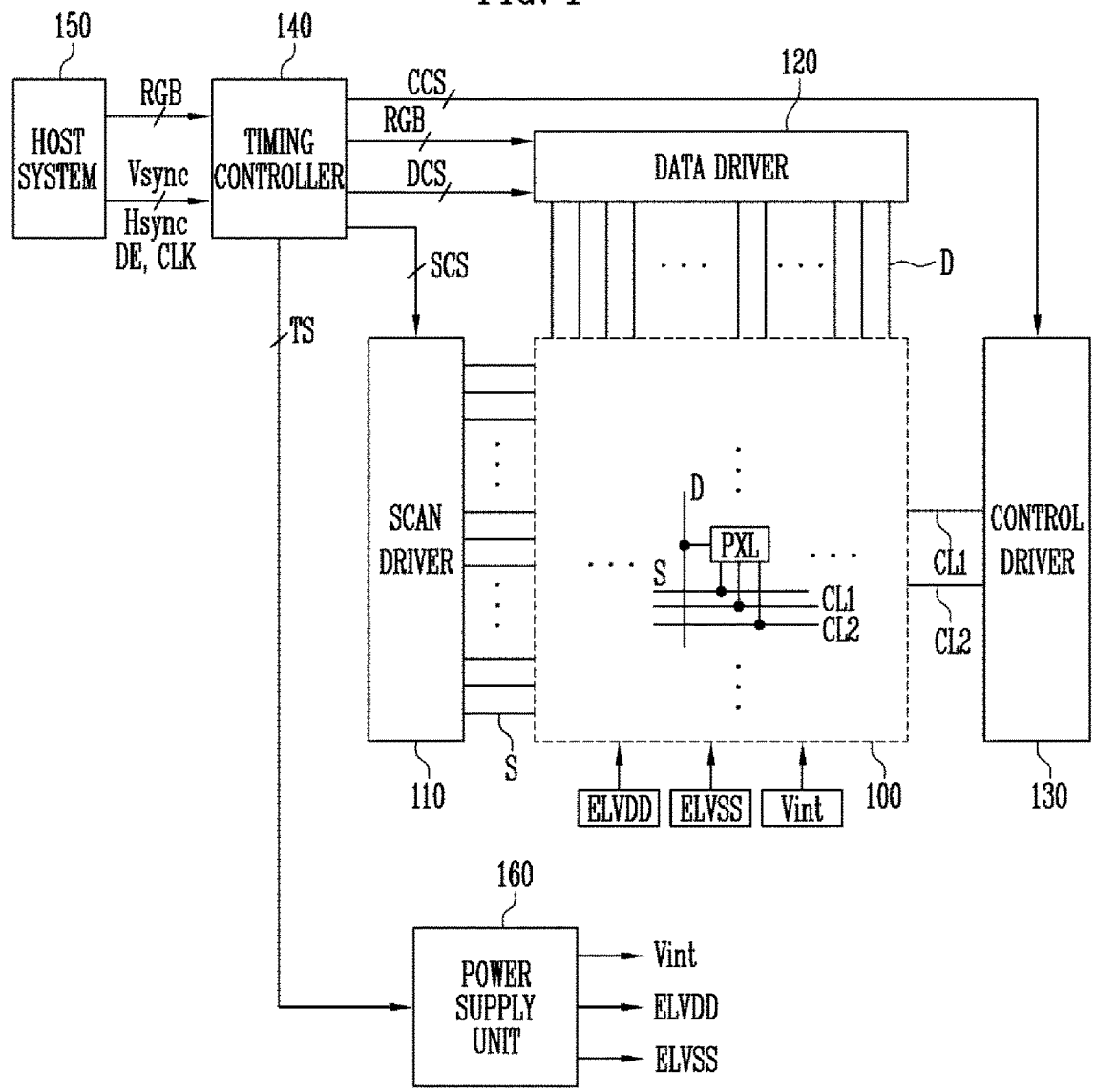
FIG. 1 is a diagram illustrating an organic light emitting display device according to an exemplary embodiment of the inventive concept.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the inventive concept.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular exemplary embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a diagram illustrating an organic light emitting display device according to an exemplary embodiment of the inventive concept.

Referring to FIG. 1, the organic light emitting display device includes a pixel unit 100, a scan driver 110, a data driver 120, a control driver 130, a timing controller 140, a host system 150, and a power supply unit 160.

The host system 150 supplies image data RGB to the timing controller 140 through a predetermined interface. Also, the host system 150 may supply, to the timing controller 140, a vertical synchronization signal Vsync, a horizontal synchronization signal Hsync, a data enable signal DE, a clock signal CLK, and the like.

The timing controller 140 generates a scan driving control signal SCS, a data driving control signal DCS, a control driving control signal CCS, and a timing signal TS, corresponding to the vertical synchronization signal Vsync, the horizontal synchronization signal Hsync, the data enable signal DE, the clock signal CLK, and the like, which are output from the host system 150.

The scan driving control signal SCS generated by the timing controller 140 is supplied to the scan driver 110, the data driving control signal DCS generated by the timing controller 140 is supplied to the data driver 120, the control driving control signal CCS generated by the timing controller 140 is supplied to the control driver 130, and the timing signal TS generated by the timing controller 140 is supplied to the power supply unit 160. In addition, the timing controller 140 realigns data RGB supplied from the outside and supplies the realigned data RGB to the data driver 120.

The scan driving control signal SCS may include a scan start pulse and clock signals. The scan start pulse controls a first timing of a scan signal. The clock signals are used to shift the scan start pulse.

The data driving control signal DCS may include a source start pulse and clock signals. The source start pulse controls a sampling start time of data. The clock signals are used control a sampling operation.

The control driving control signal CCS controls the control driver 130. The control driving control signal CCS may include at least one control start pulse.

Figure 3:
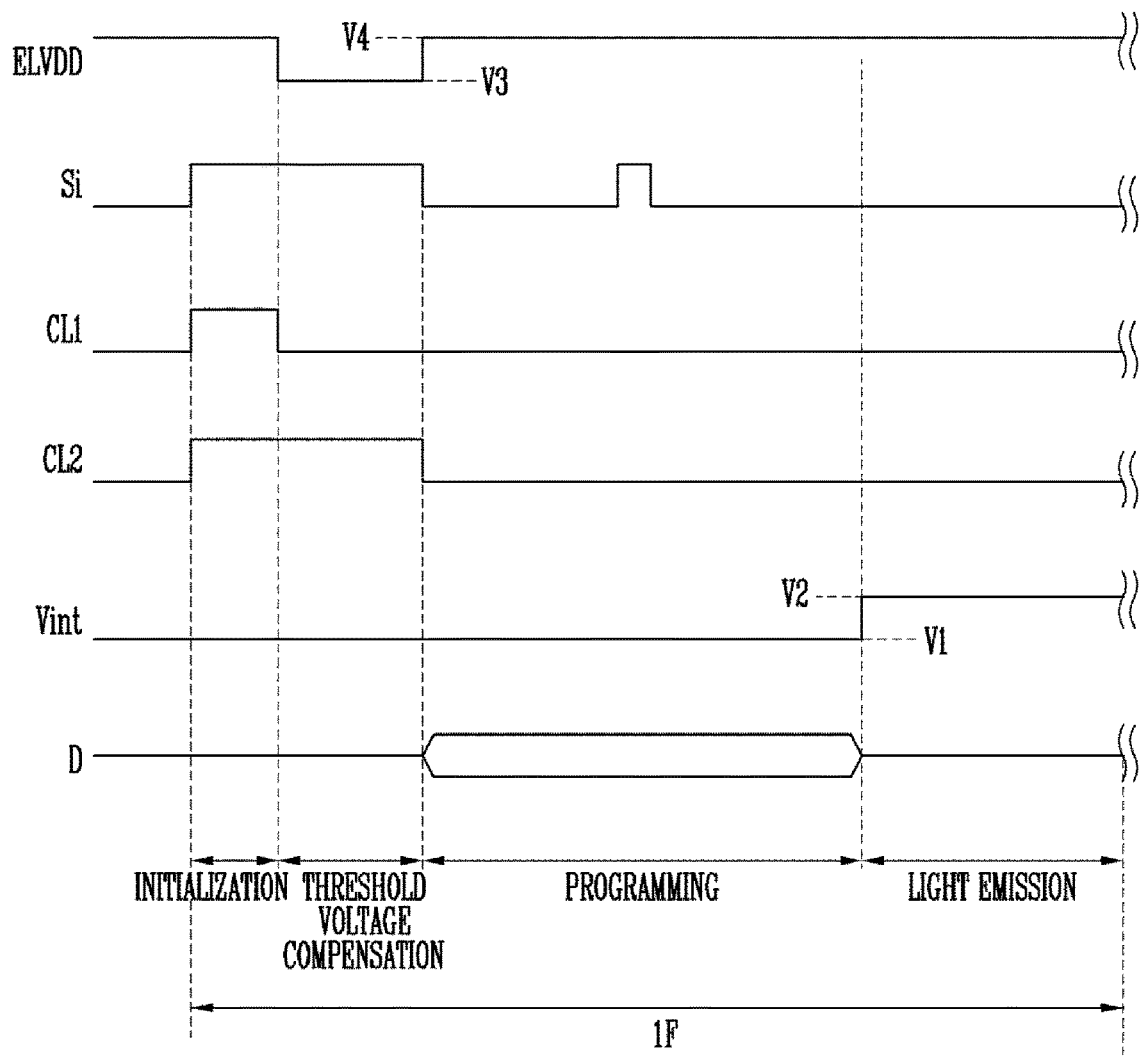
FIG. 3 is a waveform diagram illustrating an exemplary embodiment of a driving method of the pixel shown in FIG. 2.

The timing signal TS may include signals for dividing one frame period. For example, the timing signal TS may include signals for dividing one frame period into an initialization period, a threshold voltage compensation period, a programming period, and a light emission period, which are shown in FIG. 3.

The scan driver 110 supplies a scan signal to scan lines S in response to the scan driving control signal SCS. For example, the scan driver 110, as shown in FIG. 3, may simultaneously supply the scan signal to the scan lines S during the initialization period and the threshold voltage compensation period. The scan driver 110 may sequentially supply the scan signal to the scan lines during the programming period. If the scan signal is supplied to the scan lines S, pixels PXL are selected. To this end, the scan signal may be set to a gate-on voltage such that transistors included in the pixels PXL can be turned on.

The scan driver 110 may be mounted on a substrate through a thin film process. The scan driver 110 may be located at both sides of the pixel unit 100.

The data driver 120 supplies a data signal to data lines D, corresponding to the data driving control signal DCS. For example, the data driver 120 may supply the data signal to the data lines D to be synchronized with the scan signal supplied to the scan lines S during the programming period. The data signal supplied to the data lines D is supplied to the pixels PXL selected by the scan signal. The data driver 120 supplies a predetermined voltage to the data lines D during the other periods (i.e., the initialization period, the threshold voltage compensation period, and the light emission period) except the programming period. Here, the predetermined voltage may be set to a specific voltage within a voltage range of the data signal supplied from the data driver 120.

The control driver 130 supplies a first control signal to a first control line CL1 and supplies a second control signal to a second control line CL2. For example, the control driver 130 may supply the first control signal to the first control line CL1 during the initialization period, and supply the second signal to the second control line CL2 during the initialization period and the threshold voltage compensation period. If the first control signal is supplied to the first control line CL1 and the second control signal is supplied to the second control line CL2, an anode electrode of an organic light emitting diode OLED and a gate electrode of a driving transistor, which are included in each of the pixels PXL, are initialized.

Each of the first control signal and the second control signal is set to the gate-on voltage such that the transistors included in the pixels PXL can be turned on. Additionally, the first control line CL1 and the second control line CL2 are commonly coupled to the pixels PXL, and accordingly, the pixels PXL can be driven in a simultaneous driving manner.

In FIG. 1, the control driver 130 is illustrated as a driver separate from the scan driver 110, but the inventive concept is not limited thereto. For example, the control driver 130 and the scan driver 110 may be implemented as one driver.

The power supply unit 160 generates an initialization power source Vint, a first driving power source ELVDD, and a second driving power source ELVSS and supplies the initialization power source Vint, the first driving power source ELVDD, and the second driving power source ELVSS to the pixels PXL.

The power supply unit 160 supplies the initialization power source Vint having a first voltage V1 to the pixels PXL during the initialization period, the threshold voltage compensation period, and the programming period, and supplies the initialization power source Vint having a second voltage V2 to the pixels PXL during the light emission period. Here, the second voltage V2 is set to a voltage higher than the first voltage V1.

The power supply unit 160 also supplies the first driving power source ELVDD having a third voltage V3 to the pixels PXL during the threshold voltage compensation period, and supplies the first driving power source ELVDD having a fourth voltage V4 to the pixels PXL during the other periods (i.e., the initialization period, the programming period, and the light emission period). Here, the third voltage V3 is set to a voltage lower than the first voltage V1.

The power supply unit 160 supplies the second driving power source ELVSS having a predetermined voltage to the pixels PXL during one frame period 1F. That is, the second driving power source ELVSS maintains a constant voltage during the one frame period 1F. The voltage of the second driving power source ELVSS is set to a voltage lower than the fourth voltage V4 such that the pixels PXL can emit light during the light emission period.

The pixel unit 100 includes pixels PXL located to be coupled to the data lines D, the scan lines S, the first control line CL1, and the second control line CL2. The pixels PXL are supplied with the first driving power source ELVDD, the second driving power source ELVSS, and the initialization power source Vint from the power supply unit 160.

Each of the pixels PXL is supplied with the data signal from the data line D during the programming period. The pixel supplied with the data signal controls the amount of current flowing from the first driving power source ELVDD to the second driving power source ELVSS via an organic light emitting diode (not shown), corresponding to the data signal, during the light emission period. At this time, the organic light emitting diode generates light with a predetermined luminance corresponding to the amount of the current.

Figure 2:
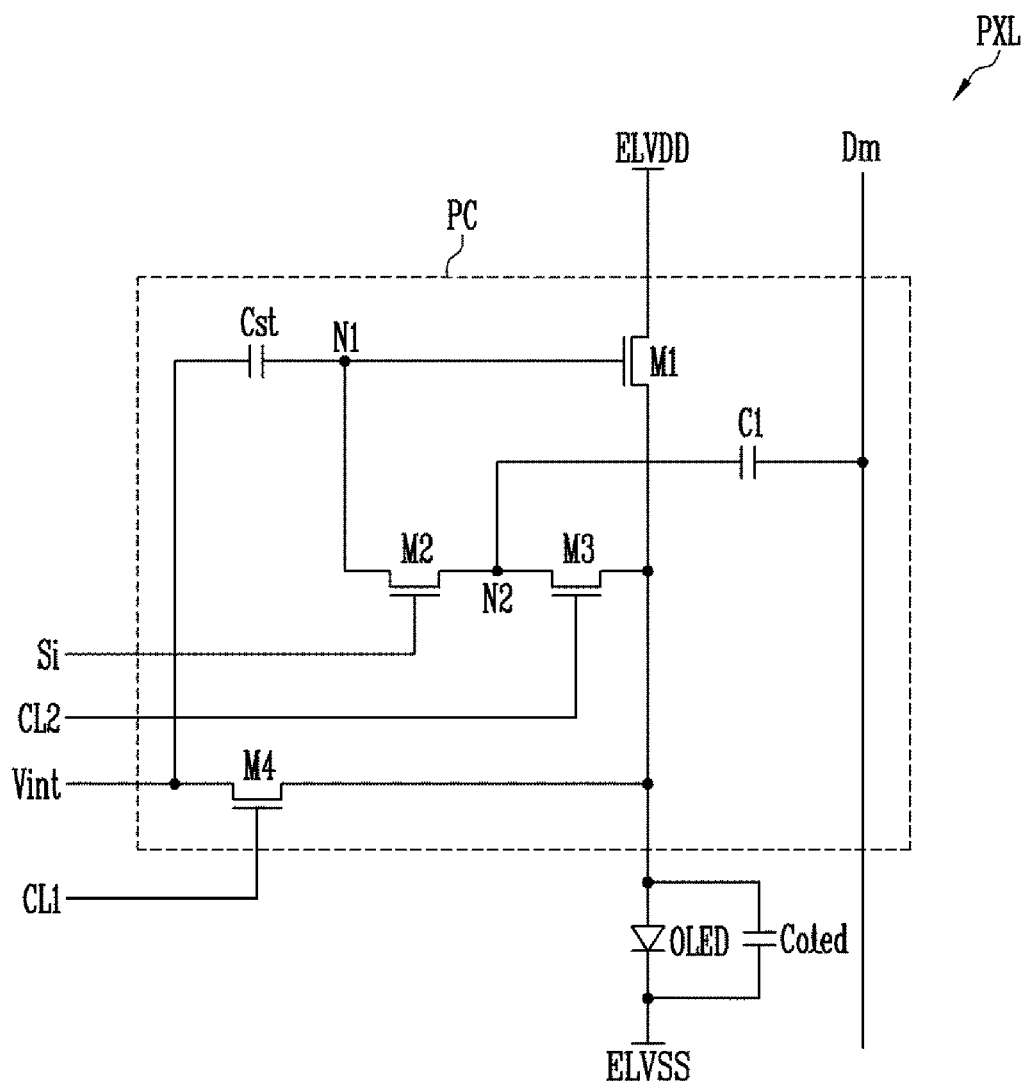
FIG. 2 is a diagram illustrating an exemplary embodiment of a pixel shown in FIG. 1.

FIG. 2 is a diagram illustrating an exemplary embodiment of the pixel shown in FIG. 1. For convenience of illustration, a pixel coupled to an ith (i is a natural number) scan line Si and an mth data line Dm is illustrated in FIG. 2.

Referring to FIG. 2, the pixel PXL according to the exemplary embodiment of the inventive concept includes an organic light emitting diode OLED and a pixel circuit PC for controlling the amount of current supplied to the organic light emitting diode OLED.

An anode electrode of the organic light emitting diode OLED is coupled to the pixel circuit PC, and a cathode electrode of the organic light emitting diode OLED is coupled to the second driving power source ELVSS. The organic light emitting diode OLED generates light with a predetermined luminance corresponding to the amount of current supplied from the pixel circuit PC during the light emission period.

The pixel circuit PC controls the amount of current flowing from the first driving power source ELVDD to the second driving power source ELVSS via the organic light emitting diode OLED, corresponding to the data signal, curing the light emission period. To this end, the pixel circuit PC includes first to fourth transistors M1 to M4, a storage capacitor Cst, and a first capacitor C1.

A first electrode of the first transistor (or driving transistor) M1 is coupled to the first driving power source ELVDD, and a second electrode of the first transistor M1 is coupled to the anode electrode of the organic light emitting diode OLED. In addition, a gate electrode of the first transistor M1 is coupled to a first node N1. The first transistor M1 controls the amount of current flowing the first driving power source ELVDD to the second driving power source ELVSS via the organic light emitting diode OLED, corresponding to a voltage of the first node N1.

The second transistor M2 and the third transistor M3 are coupled in series between the first node N1 and the anode electrode of the organic light emitting diode OLED. That is, the second transistor M2 is coupled between the first node N1 and a second node N2, and the third transistor M3 is coupled between the second node N2 and the anode electrode of the organic light emitting diode OLED.

A gate electrode of the second transistor M2 is coupled to an ith scan line Si. The second transistor M2 is turned on when the scan signal is supplied to the ith scan line Si to allow the first node N1 and the second node N2 to be electrically coupled to each other.

A gate electrode of the third transistor M3 is coupled to the second control line CL2. The third transistor M3 is turned on when the second control signal is supplied to the second control line CL2 to allow the second node N2 and the anode electrode of the organic light emitting diode OLED to be electrically coupled to each other.

The fourth transistor M4 is coupled between the initialization power source Vint and the anode electrode of the organic light emitting diode OLED. In addition, a gate electrode of the fourth transistor M4 is coupled to the first control line CL1. The fourth transistor M4 is turned on when the first control signal is supplied to the first control line CL1. If the fourth transistor M4 is turned on, the first voltage V1 of the initialization power source Vint is supplied to the anode electrode of the organic light emitting diode OLED.

The storage capacitor Cst is coupled between the initialization power source Vint and the first node N1. The storage capacitor Cst stores voltages corresponding to the data signal and a threshold voltage of the first transistor M1.

The first capacitor C1 is coupled between a data line Dm and the second node N2 that is a common node of the second transistor M2 and the third transistor M3. The first capacitor C1 controls a voltage of the second node N2, corresponding to a voltage of the data line Dm.

FIG. 3 is a waveform diagram illustrating an exemplary embodiment of a driving method of the pixel shown in FIG. 2.

Referring to FIG. 3, one frame period 1F is divided into an initialization period, a threshold voltage compensation period, a programming period, and a light emission period.

During the initialization period, the first node N1 and the anode electrode of the organic light emitting diode OLED are initialized to the first voltage V1 by the initialization power source Vint.

During the threshold voltage compensation period, a voltage corresponding to the threshold voltage of the first transistor M1 is stored in the storage capacitor Cst.

During the programming period, a voltage corresponding to the data signal is stored in the storage capacitor Cst.

During the light emission period, the organic light emitting diode OLED generates light with a predetermined luminance corresponding to the amount of current supplied from the pixel circuit PC.

An operating process of the pixel PXL will be described. First, the scan signal is supplied to all of the scan lines S during the initialization period. In addition, during the initialization period, the first control signal is supplied to the first control line CL1, and the second control signal is supplied to the second control line CL2.

If the first control signal is supplied to the first control line CL1, the fourth transistor M4 included in each of the pixels PXL is turned on. If the fourth transistor M4 is turned on, the first voltage V1 of the initialization power source Vint is supplied to the anode electrode of the organic light emitting diode OLED.

If the second control signal is supplied to the second control line CL2, the third transistor M3 included in each of the pixels PXL is turned on. If the scan signal is supplied to the scan lines S, the second transistor M2 included in each of the pixels PXL is turned on. If the second transistor M2 and the third transistor M3 are turned on, the first node N1 and the anode electrode of the organic light emitting diode OLED are electrically coupled to each other. Then, the first voltage of the initialization power source Vint is supplied to the first node N1. That is, during the initialization period, the anode electrode of the organic light emitting diode OLED and the first node N1, which are included in each of the pixels PXL, are initialized to the first voltage V1 of the initialization power source Vint. Here, the first voltage V1 may be set such that the organic light emitting diode OLED does not emit light.

The supply of the first control to the first control line CL1 is stopped during the threshold voltage compensation period. If the supply of the first control signal to the first control line CL1 is stopped, the fourth transistor M4 is turned off. In addition, the first driving power source ELVDD is set to the third voltage V3 during the threshold voltage compensation period. Here, the third voltage V3 is set to a voltage lower than the first voltage V1.

During the threshold voltage compensation period, the scan signal is supplied to the scan lines S, and the second control signal is supplied to the second control line CL2. That is, the supply of the scan signal and the second control signal is maintained during the initialization period and the threshold voltage compensation period.

If the second transistor M2 and the third transistor M3 are turned on, the first transistor M1 is diode-coupled such that current can flow from the anode electrode of the organic light emitting diode OLED to the first driving power source ELVDD. Then, current is supplied from the first node N1 and the anode electrode of the organic light emitting diode OLED, which are set to the first voltage V1, to the first driving power source ELVDD set to the third voltage V3.

At this time, since the first transistor M1 is diode-coupled, as described above, the voltage of the first node N1 is set to a voltage obtained by adding an absolute value of the threshold voltage of the first transistor M1 to the third voltage V3 of the first driving power source ELVDD. That is, a voltage corresponding to the threshold voltage of the first transistor M1 is applied to the first node N1 during the threshold voltage compensation period. The voltage corresponding to the threshold voltage of the first transistor M1, which is applied to the first node N1, is stored in the storage capacitor Cst during the threshold voltage compensation period.

The scan signal is simultaneously supplied to all of the scan lines S during the initialization period and the threshold voltage compensation period. Therefore, a voltage corresponding to the threshold voltage of the first transistor M1 coupled to the storage capacitor Cst included in each of the pixels PXL is stored in the storage capacitor Cst during the initialization period and the threshold voltage compensation period.

The scan signal is sequentially supplied to the scan lines S during the programming period. In addition, the first driving power source ELVDD is set to the fourth voltage V4 higher than the third voltage V3.

If the scan signal is supplied to the ith scan line Si, the second transistor M2 coupled to the ith scan line Si is turned on. If the second transistor M2 is turned on, the first node N1 and the second node N2 are electrically coupled to each other.

A data signal is supplied to the data line Dm to be synchronized with the ith scan line Si. If the data signal is supplied to the data line Dm, voltages of the second node N2 and the first node N1 are changed by coupling of the first capacitor C1. That is, if the second transistor M2 is turned on, the voltage of the first node N1 is set corresponding to the voltage of the data signal. Therefore, voltages corresponding to the threshold voltage of the first transistor M1 and the data signal are stored in the storage capacitor Cst included in each of the pixels PXL during the programming period.

In other words, the scan signal is sequentially supplied to the scan lines S during the programming period. Then, the second transistors M2 included in the respective pixels PXL are turned on in units of horizontal lines, and accordingly, a voltage corresponding to a desired data signal can be stored in each of the pixels PXL.

The initialization power source Vint is set to the second voltage V2 during the light emission period. If the initialization power source Vint is set to the second voltage V2, i.e., if the initialization power source Vint is increased from the first voltage V1 to the second voltage V2, the voltage of the first node N1 is increased by coupling of the storage capacitor Cst. At this time, the first transistor M1 controls the amount of current from the first driving power source ELVDD set to the fourth voltage V4 to the second driving power source ELVSS via the organic light emitting diode OLED, corresponding to the voltage of the first node N1. To this end, the fourth voltage V4 and the second voltage V2 may be set such that current can be supplied to the pixels PXL.

As described above, the pixel PXL according to an exemplary embodiment of the inventive concept generate light with a predetermined luminance by passing through the initialization period, the threshold voltage compensation period, the programming period, and the light emission period during the one frame period 1F.

In an exemplary embodiment of the inventive concept, the first capacitor C1 may be coupled between the data line Dm and the second node N2, and accordingly, an image with uniform luminance can be displayed in the pixel unit 100.

In detail, if the first capacitor C1 is coupled between the data line Dm and the anode electrode of the organic light emitting diode OLED, a voltage of the anode electrode of the organic light emitting diode OLED is changed by the data signal supplied to the data line Dm during the programming period. At this time, a charging voltage of an organic capacitor Coled is changed corresponding to the change in voltage of the anode electrode of the organic light emitting diode OLED.

Then, amounts of leakage current supplied from the first driving power source ELVDD and the initialization power source Vint to the anode electrode of the organic light emitting diode OLED are set differently for the respective pixels PXL. In this case, amounts of leakage current between the first nodes N1 and the anode electrodes of the organic light emitting diodes OLED, which are included in the respective pixels PXL, are set differently, and accordingly, light with different luminances may be generated in the respective pixels PXL even when the same data signal is supplied.

On the other hand, in the inventive concept, if the first capacitor C1 is formed between the second node N2 and the data line Dm, the anode electrodes of the organic light emitting diodes OLED included in the respective pixels PXL maintain a uniform voltage regardless of a change in voltage of the data line Dm. Then, amounts of leakage current between the first nodes N1 and the anode electrodes of the organic light emitting diodes OLED, which are included in the respective pixels PXL, are set to be approximately equal to one another, and accordingly, light with an approximately equal luminance can be generated from each of the pixels PXL, corresponding to the same data signal.

In an exemplary embodiment of the inventive concept, the voltage of the second node N2 may be changed corresponding to the data signal supplied to the data line Dm. Here, since the second node N2 is not coupled to a separate capacitor (i.e., since the voltage of the second node N2 is not maintained), the voltage of the second node N2 has no influence on the voltage of the first node N1.

Although FIG. 2 illustrates that the transistors M1 to M4 are formed as N-type transistors (e.g., NMOS transistors), the inventive concept is not limited thereto. For example, at least one of the second transistor M2, the third transistor M3, and the fourth transistor M4 may be formed as a P-type transistor (e.g., a PMOS transistor).

Figure 4:
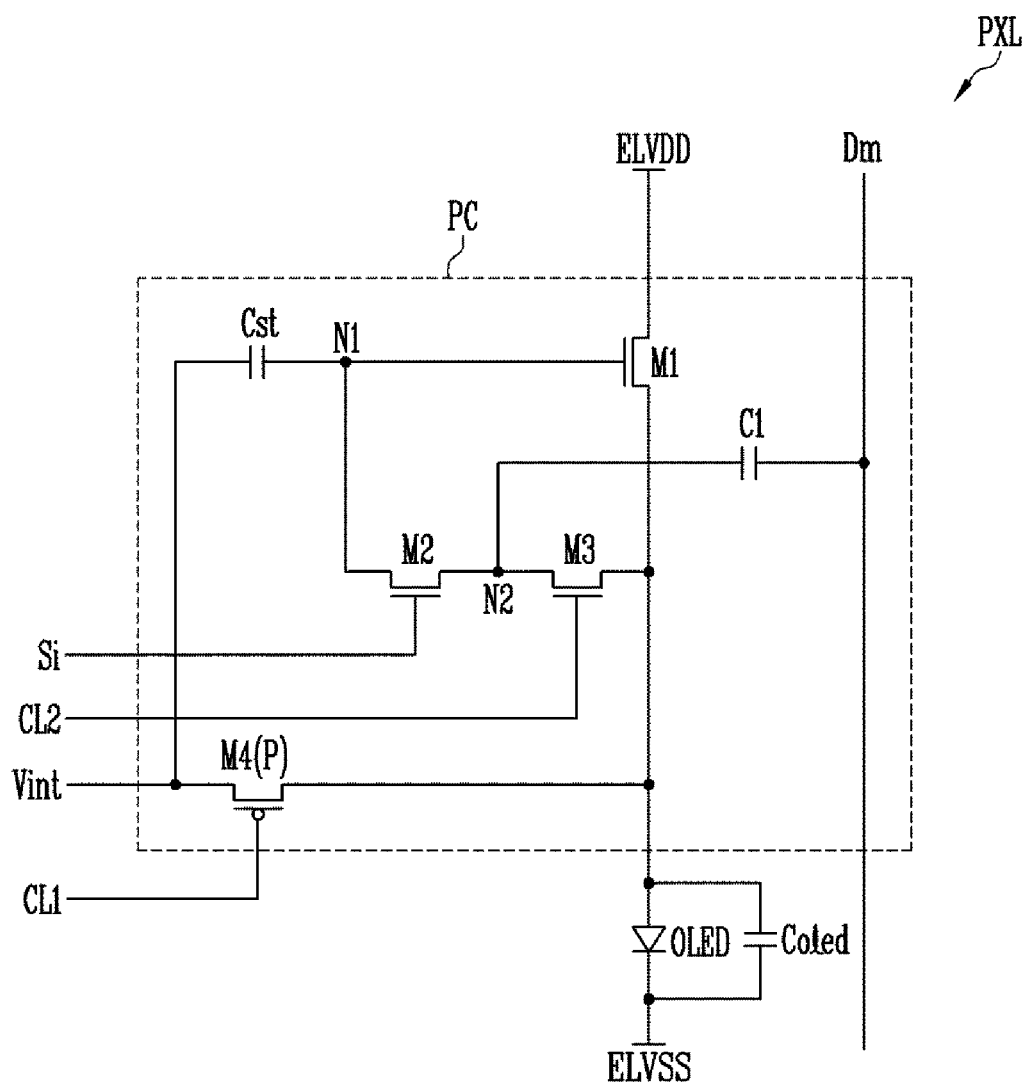
FIG. 4 is a diagram illustrating another exemplary embodiment of the pixel shown in FIG. 1.

FIG. 4 is a diagram illustrating another exemplary embodiment of the pixel shown in FIG. 1. In FIG. 4, components (e.g., the pixel circuit PC and the like) identical to those of FIG. 2 are designated by like reference numerals, and their detailed descriptions will be omitted.

Referring to FIG. 4, the pixel PXL according to this exemplary embodiment of the inventive concept includes an organic light emitting diode OLED and a pixel circuit PC for controlling the amount of current supplied to the organic light emitting diode OLED.

An anode electrode of the organic light emitting diode OLED is coupled to the pixel circuit PC, and a cathode electrode of the organic light emitting diode OLED is coupled to the second driving power source ELVSS. The organic light emitting diode OLED generates light with a predetermined luminance corresponding to the amount of current supplied from the pixel circuit PC during the light emission period.

The pixel circuit PC controls the amount of current flowing from the first driving power source ELVDD to the second driving power source ELVSS via the organic light emitting diode OLED, corresponding to the data signal during the light emission period. To this end, the pixel circuit PC includes a first transistor M1, a second transistor M2, a third transistor M3, and a fourth transistor M4(P).

The fourth transistor M4(P) is coupled between the initialization power source Vint and the anode electrode of the organic light emitting diode OLED. In addition, a gate electrode of the fourth transistor M4(P) is coupled to the first control line CL1. The fourth transistor M4(P) is turned on when the first control signal is supplied to the first control line CL1. If the fourth transistor M4(P) is turned on, the first voltage V1 of the initialization power source Vint is supplied to the anode electrode of the organic light emitting diode OLED.

Figure 5:
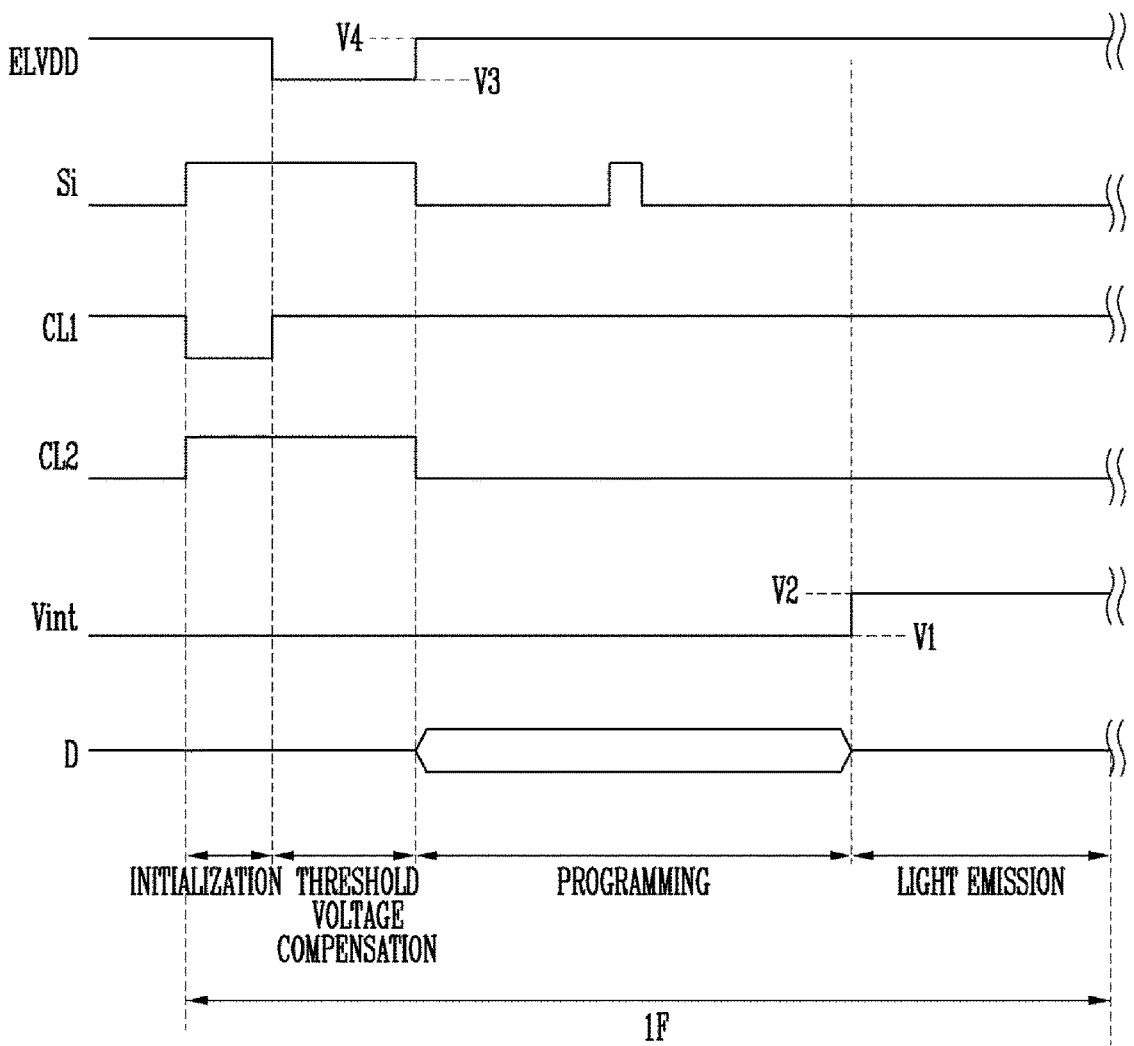
FIG. 5 is a waveform diagram illustrating an exemplary embodiment of a driving method of the pixel shown in FIG. 4.

In this exemplary embodiment of the inventive concept, the other components and operating process of the pixel PXL are set identically to those of FIG. 2, except that the fourth transistor M4(P) is formed as a P-type transistor. However, when the fourth transistor M4(P) is formed as the P-type transistor, the polarity of the first control signal supplied to the first control line CL1 is reversed, as shown in FIG. 5. That is, the first control signal may be set to a low voltage to have the gate-on voltage.

Figure 6:
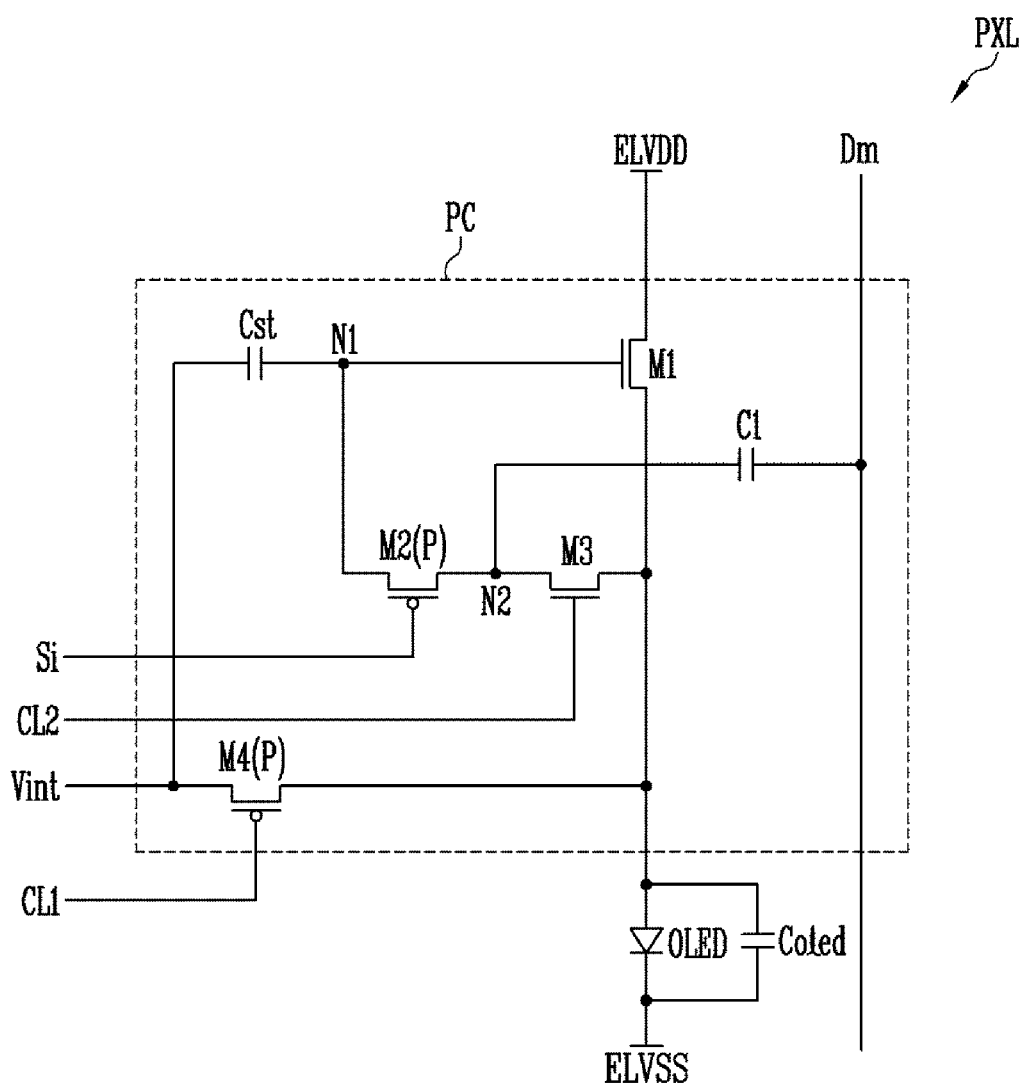
FIG. 6 is a diagram illustrating still another exemplary embodiment of the pixel shown in FIG. 1.

FIG. 6 is a diagram illustrating still another exemplary embodiment of the pixel shown in FIG. 1. In FIG. 6, components identical to those of FIG. 4 are designated by like reference numerals, and their detailed descriptions will be omitted.

Referring to FIG. 6, the pixel PXL according to this exemplary embodiment of the inventive concept includes an organic light emitting diode OLED and a pixel circuit PC for controlling the amount of current supplied to the organic light emitting diode OLED.

An anode electrode of the organic light emitting diode OLED is coupled to the pixel circuit PC, and a cathode electrode of the organic light emitting diode OLED is coupled to the second driving power source ELVSS. The organic light emitting diode OLED generates light with a predetermined luminance corresponding to the amount of current supplied from the pixel circuit PC during the light emission period.

During the light emission period, the pixel circuit PC controls the amount of current flowing from the first driving power source ELVDD to the second driving power source ELVSS via the organic light emitting diode OLED, corresponding to the data signal. To this end, the pixel circuit PC includes a first transistor M1, a second transistor M2(P), a third transistor M3, and a fourth transistor M4(P).

The second transistor M2(P) is coupled between the first node N1 and the second node N2. In addition, a gate electrode of the second transistor M2(P) is coupled to the ith scan line Si. The second transistor M2(P) is turned on when the scan signal is supplied to the ith scan line Si to allow the first node N1 and the second node N2 to be electrically coupled to each other.

Figure 7:
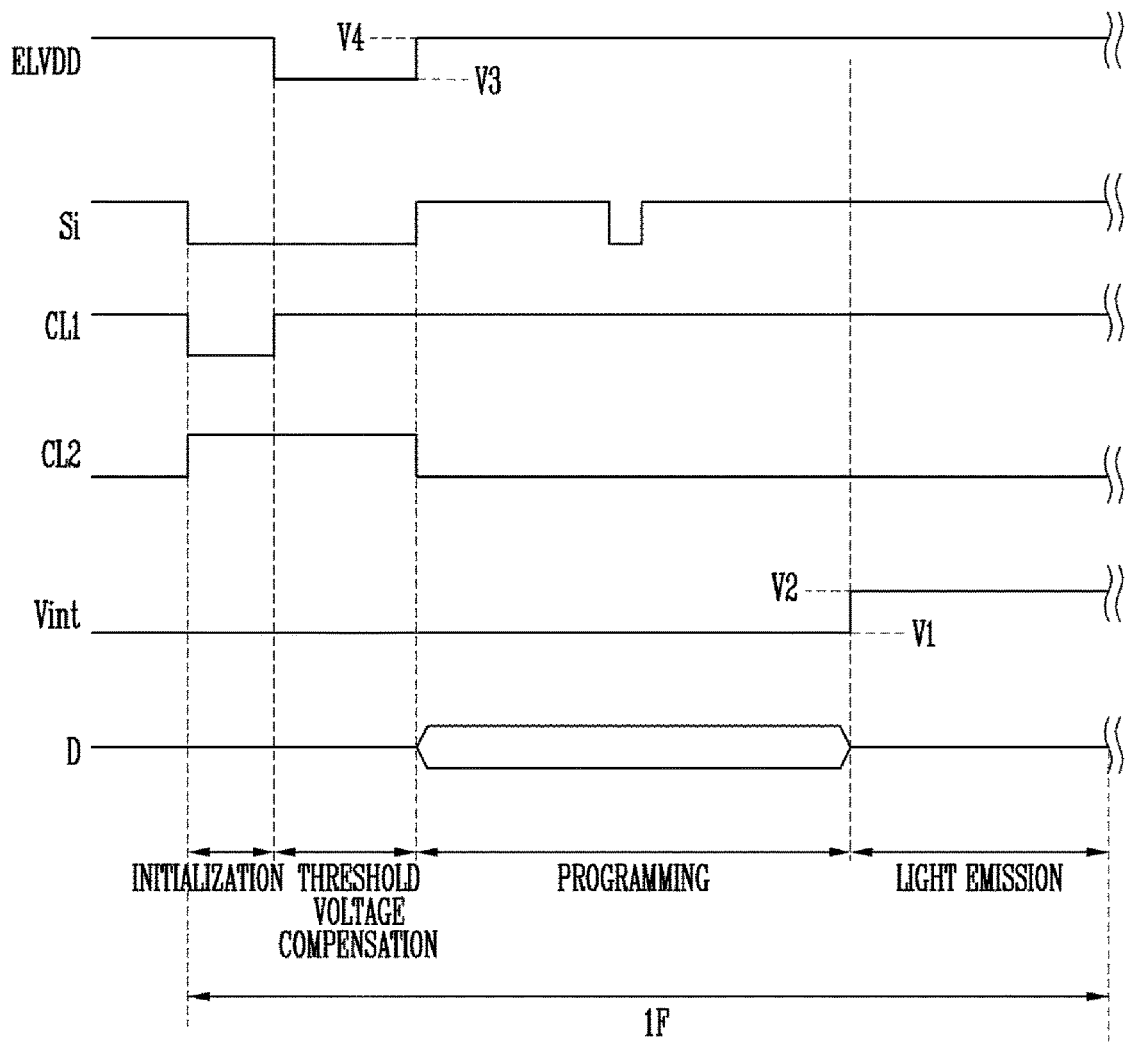
FIG. 7 is a waveform diagram illustrating an exemplary embodiment of a driving method of the pixel shown in FIG. 6.

In this exemplary embodiment of the inventive concept, the other components and operating process of the pixel PXL are set identically to those of FIG. 4, except that the second transistor M2(P) is formed as a P-type transistor. However, when the second transistor M2(P) is formed as the P-type transistor, the polarity of the scan signal supplied to the ith scan line Si is reversed as shown in FIG. 7. That is, the scan signal may be set to a low voltage to have the gate-on voltage.

Figure 8:
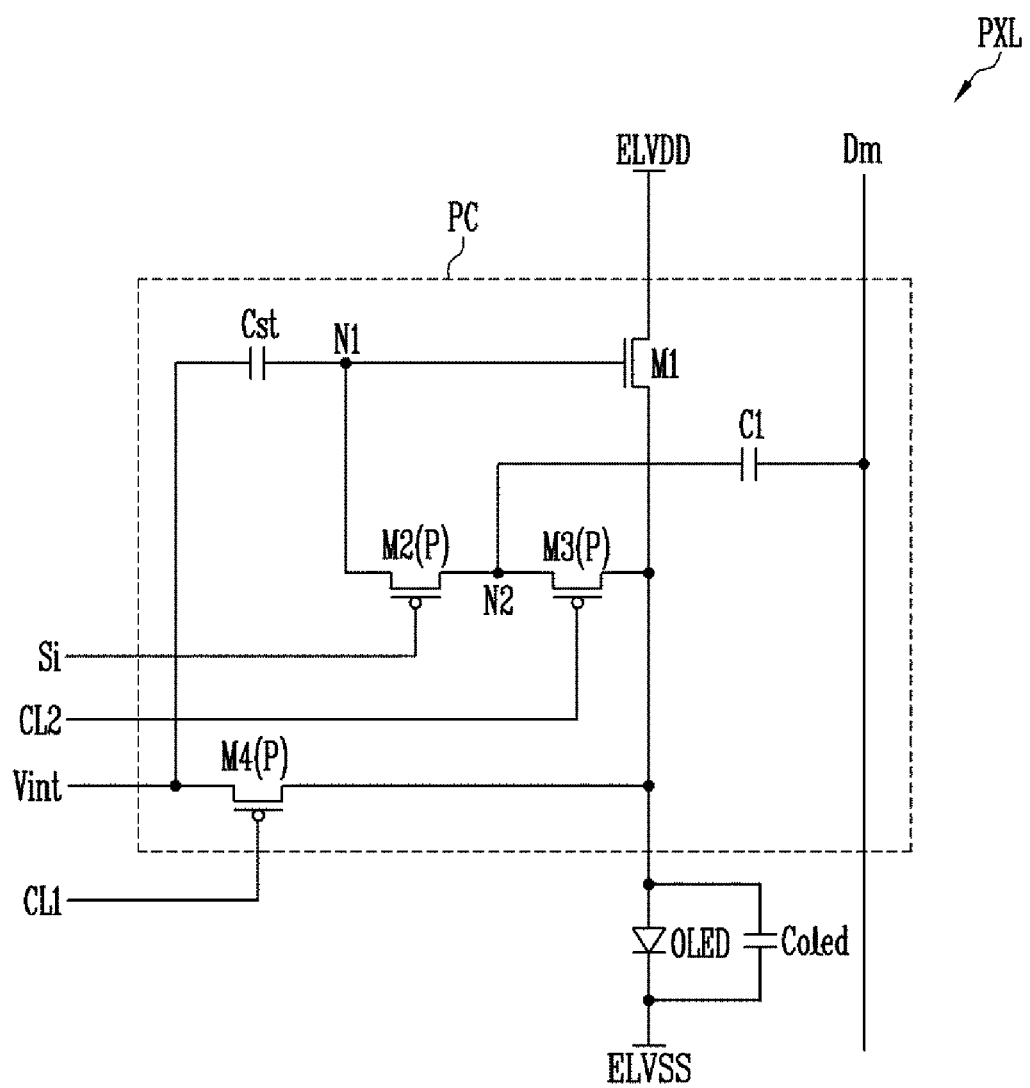
FIG. 8 is a diagram illustrating still another exemplary embodiment of the pixel shown in FIG. 1.

FIG. 8 is a diagram illustrating still another exemplary embodiment of the pixel shown in FIG. 1. In FIG. 8, components identical to those of FIG. 6 are designated by like reference numerals, and their detailed descriptions will be omitted.

Referring to FIG. 8, the pixel PXL according to this exemplary embodiment of the inventive concept includes an organic light emitting diode OLED and a pixel circuit PC for controlling the amount of current supplied to the organic light emitting diode OLED.

An anode electrode of the organic light emitting diode OLED is coupled to the pixel circuit PC, and a cathode electrode of the organic light emitting diode OLED is coupled to the second driving power source ELVSS. The organic light emitting diode OLED generates light with a predetermined luminance corresponding to the amount of current supplied from the pixel circuit PC during the light emission period.

During the light emission period, the pixel circuit PC controls the amount of current flowing from the first driving power source ELVDD to the second driving power source ELVSS via the organic light emitting diode OLED, corresponding to the data signal. To this end, the pixel circuit PC includes a first transistor M1, a second transistor M2(P), a third transistor M3(P), and a fourth transistor M4(P).

The third transistor M3(P) is coupled between the second node N2 and the anode electrode of the organic light emitting diode OLED. In addition, a gate electrode of the third transistor M3(P) is coupled to the second control line CL2. The third transistor M3(P) is turned on when the second control signal is supplied to the second control line CL2 to allow the second node N2 and the organic light emitting diode OLED to be electrically coupled to each other.

In this exemplary embodiment of the inventive concept, the other components and operating process of the pixel PXL are set identically to those of FIG. 6, except that the third transistor M3(P) is formed as a P-type transistor. However, when the third transistor M3(P) is formed as the P-type transistor, the polarity of the second control signal supplied to the second control line CL2 is reversed, as shown in FIG. 9. That is, the second control signal may be set to a low voltage to have the gate-on voltage.

In the above-described FIG. 2, it has been illustrated that the transistors M1 to M4 are formed as N-type transistors. Here, at least one of the transistors M1 to M4 may be formed as an oxide semiconductor transistor. In addition, at least one of the transistors M1 to M4 may be formed as a poly-silicon semiconductor transistor.

The oxide semiconductor transistor includes a gate electrode, a source electrode, and a drain electrode, and has an active layer formed of an oxide semiconductor. Here, the oxide semiconductor may be set as an amorphous or crystalline semiconductor. The oxide semiconductor transistor may be formed through a low temperature process, and has a lower charge mobility than the poly-silicon semiconductor transistor. The oxide semiconductor transistor has excellent off-current characteristics.

The poly-silicon semiconductor transistor includes a gate electrode, a source electrode, and a drain electrode, and has an active layer formed of poly-silicon. For example, the poly-silicon semiconductor transistor may be set as a low temperature poly-silicon (LTPS) transistor. The poly-silicon semiconductor transistor has a high electron mobility, and accordingly, has fast driving characteristics.

FIGS. 10A to 10D are diagrams illustrating still other exemplary embodiments of the pixel shown in FIG. 1. The pixels of FIGS. 10A to 10D are driven by the same driving method as the pixel of FIG. 2, and therefore, a detailed description of the driving method will be omitted.

Referring to FIGS. 10A to 10D, each of the pixels PXL according to these other exemplary embodiments of the inventive concept includes an organic light emitting diode OLED and a pixel circuit PC for controlling the amount of current supplied to the organic light emitting diode OLED.

An anode electrode of the organic light emitting diode OLED is coupled to the pixel circuit PC, and a cathode electrode of the organic light emitting diode OLED is coupled to the second driving power source ELVSS. The organic light emitting diode OLED generates light with a predetermined luminance corresponding to the amount of current supplied from the pixel circuit PC during the light emission period.

During the light emission period, the pixel circuit PC controls the amount of current flowing from the first driving power source ELVDD to the second driving power source ELVSS via the organic light emitting diode OLED, corresponding to the data signal. To this end, the pixel circuit PC includes four transistors.

Figure 10A:
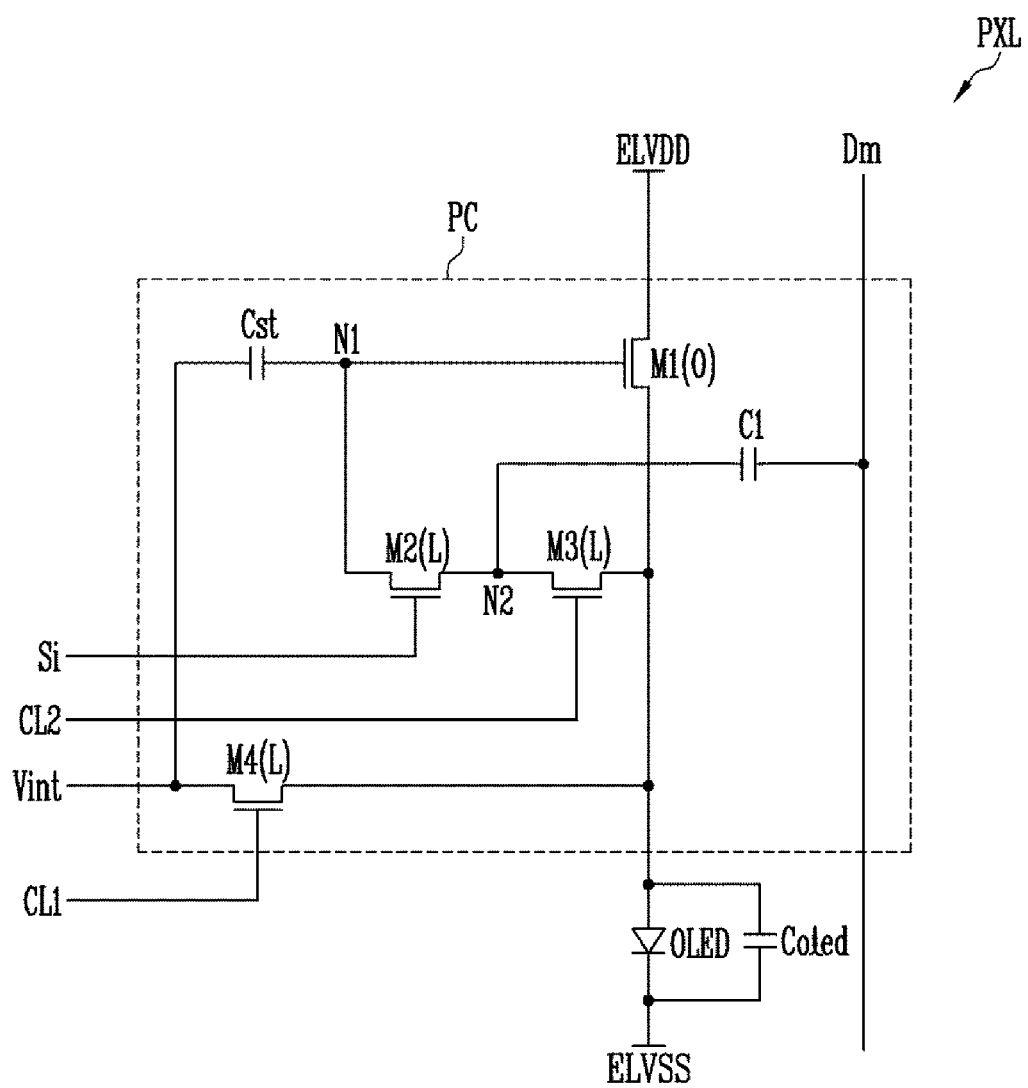
FIG. 10A, FIG. 10B, FIG. 10C, and FIG. 10D are diagrams illustrating still other exemplary embodiments of the pixel shown in FIG. 1.

Referring to FIG. 10A, a first transistor M1(O) may be formed as an oxide semiconductor transistor, and a second transistor M2(L), a third transistor M3(L), and a fourth transistor M4(L) may be formed as poly-silicon semiconductor transistors.

Figure 10B:
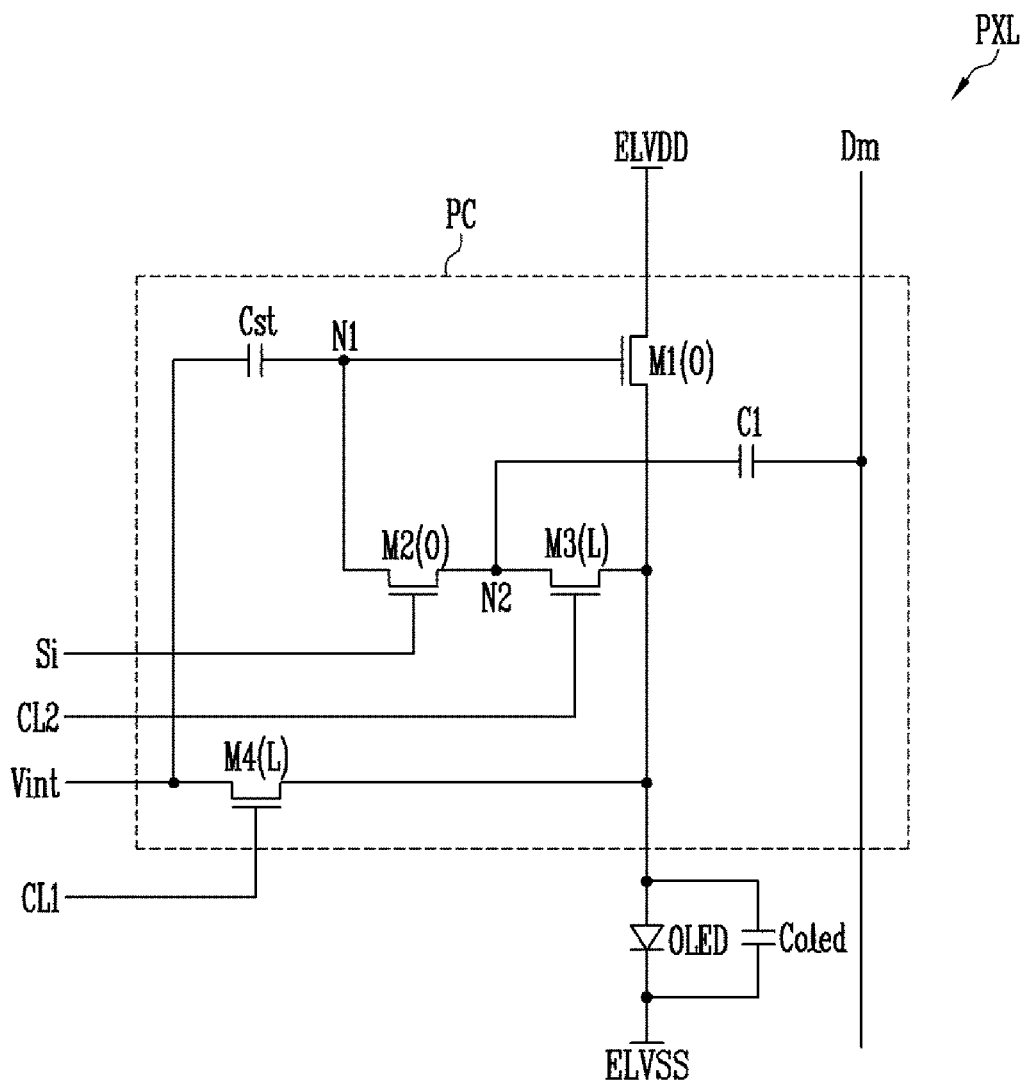

Referring to FIG. 10B, a first transistor M1(O) and a second transistor M2(O) may be formed as oxide semiconductor transistors, and a third transistor M3(L) and a fourth transistor M4(L) may be formed as poly-silicon semiconductor transistors.

Figure 10C:
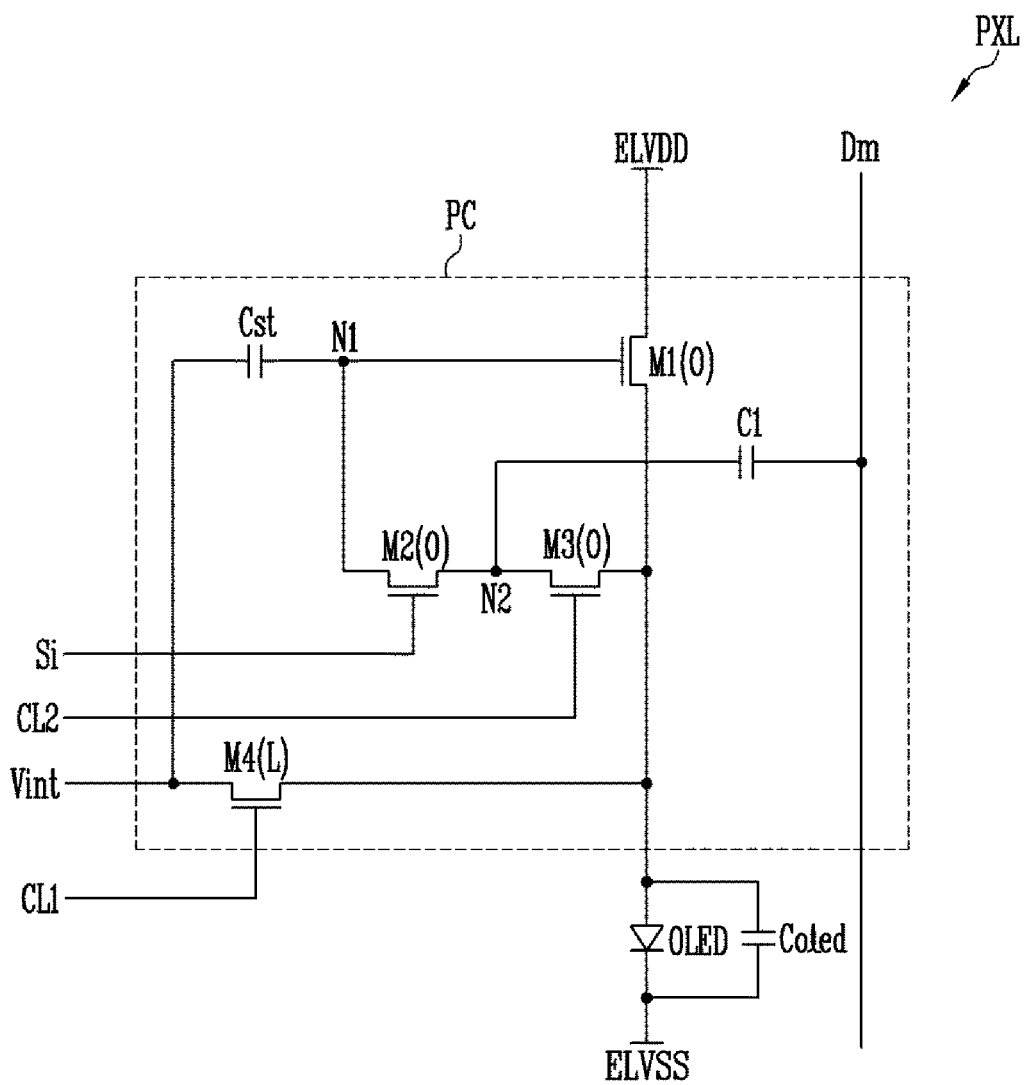

Referring to FIG. 10C, a first transistor M1(O), a second transistor M2(O), and a third transistor M3(O) may be formed as oxide semiconductor transistors, and a fourth transistor M4(L) may be formed as a poly-silicon semiconductor transistor.

Figure 10D:
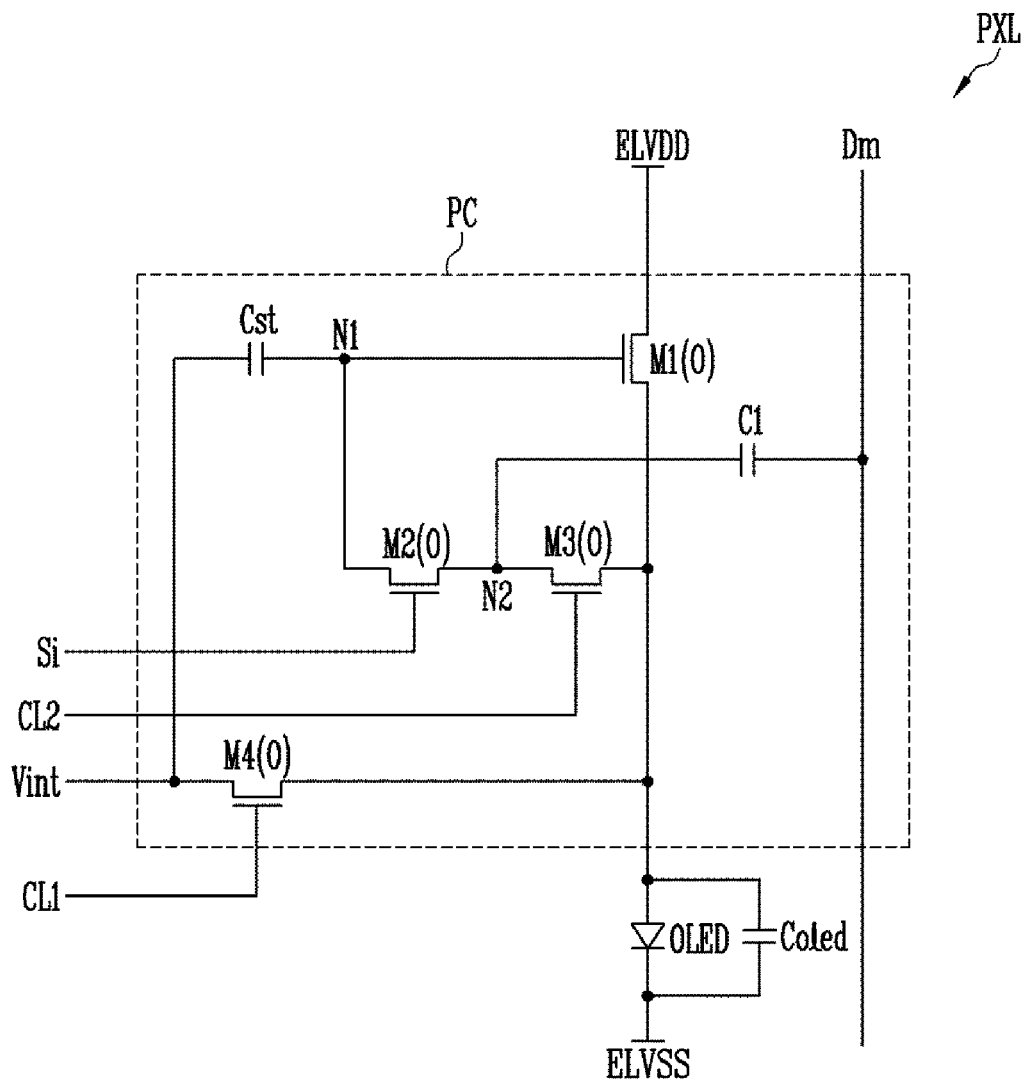

Referring to FIG. 10D, a first transistor M1(O), a second transistor M2(O), a third transistor M3(O), and a fourth transistor M4(O) may be formed as oxide semiconductor transistors.

That is, in these other exemplary embodiments of the inventive concept, at least one transistor among the first to fourth transistors M1 to M4 may be formed as an oxide semiconductor transistor. A ratio of oxide semiconductor transistors and/or poly-silicon semiconductor transistors, which are included in the pixel circuit PC, may be variously set by considering the resolution, size, etc., of a panel.

FIGS. 11A to 11D are diagrams illustrating still other exemplary embodiments of the pixel shown in FIG. 1. The pixels of FIGS. 11A to 11D are driven by the same driving method as the pixel of FIG. 2, and therefore, a detailed description of the driving method will be omitted.

Referring to FIGS. 11A to 11D, each of the pixels PXL according to these other exemplary embodiments of the inventive concept includes an organic light emitting diode OLED and a pixel circuit PC for controlling the amount of current supplied to the organic light emitting diode OLED.

An anode electrode of the organic light emitting diode OLED is coupled to the pixel circuit PC, and a cathode electrode of the organic light emitting diode OLED is coupled to the second driving power source ELVSS. The organic light emitting diode OLED generates light with a predetermined luminance corresponding to the amount of current supplied from the pixel circuit PC during the light emission period.

During the light emission period, the pixel circuit PC controls the amount of current flowing from the first driving power source ELVDD to the second driving power source ELVSS via the organic light emitting diode OLED, corresponding to the data signal. To this end, the pixel circuit PC includes four transistors.

Figure 11A:
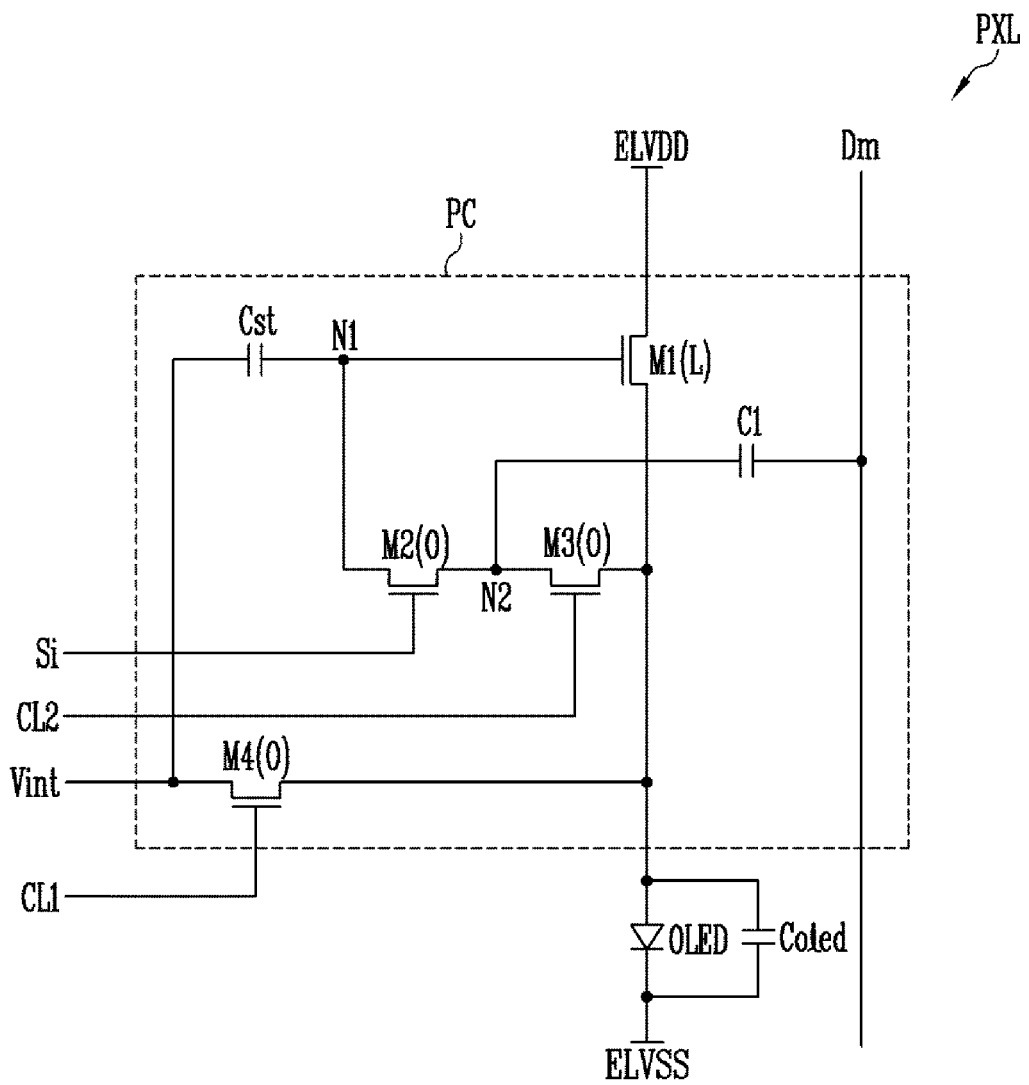
FIG. 11A, FIG. 11B, FIG. 11C, and FIG. 11D are diagrams illustrating still other exemplary embodiments of the pixel shown in FIG. 1.

Referring FIG. 11A, a first transistor M1(L) may be formed as a poly-silicon semiconductor transistor, and a second transistor M2(O), a third transistor M3(O), and a fourth transistor M4(O) may be formed as oxide semiconductor transistors.

Figure 11B:
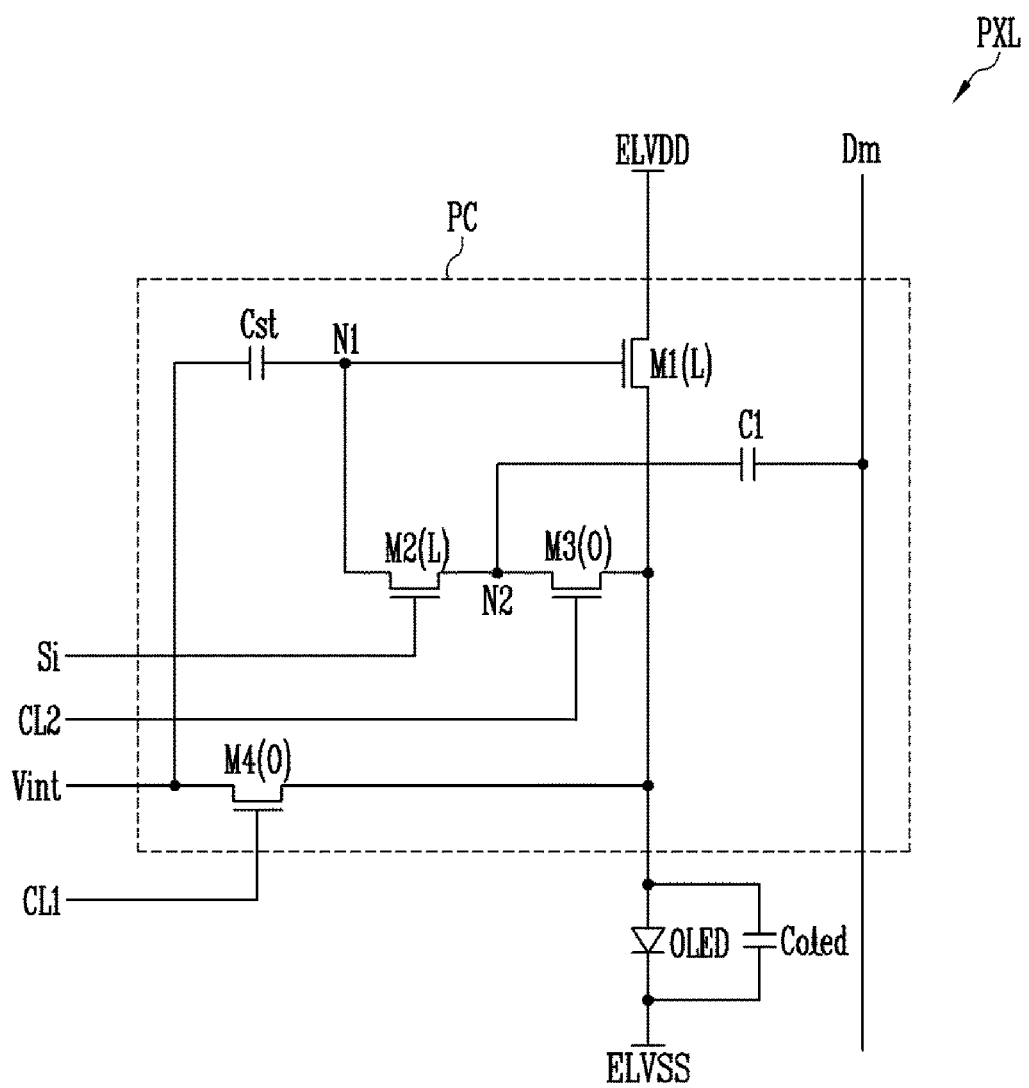

Referring to FIG. 11B, a first transistor M1(L) and a second transistor M2(L) may be formed as poly-silicon semiconductor transistors, and a third transistor M3(O) and a fourth transistor M4(O) may be formed as oxide semiconductor transistors.

Figure 11C:
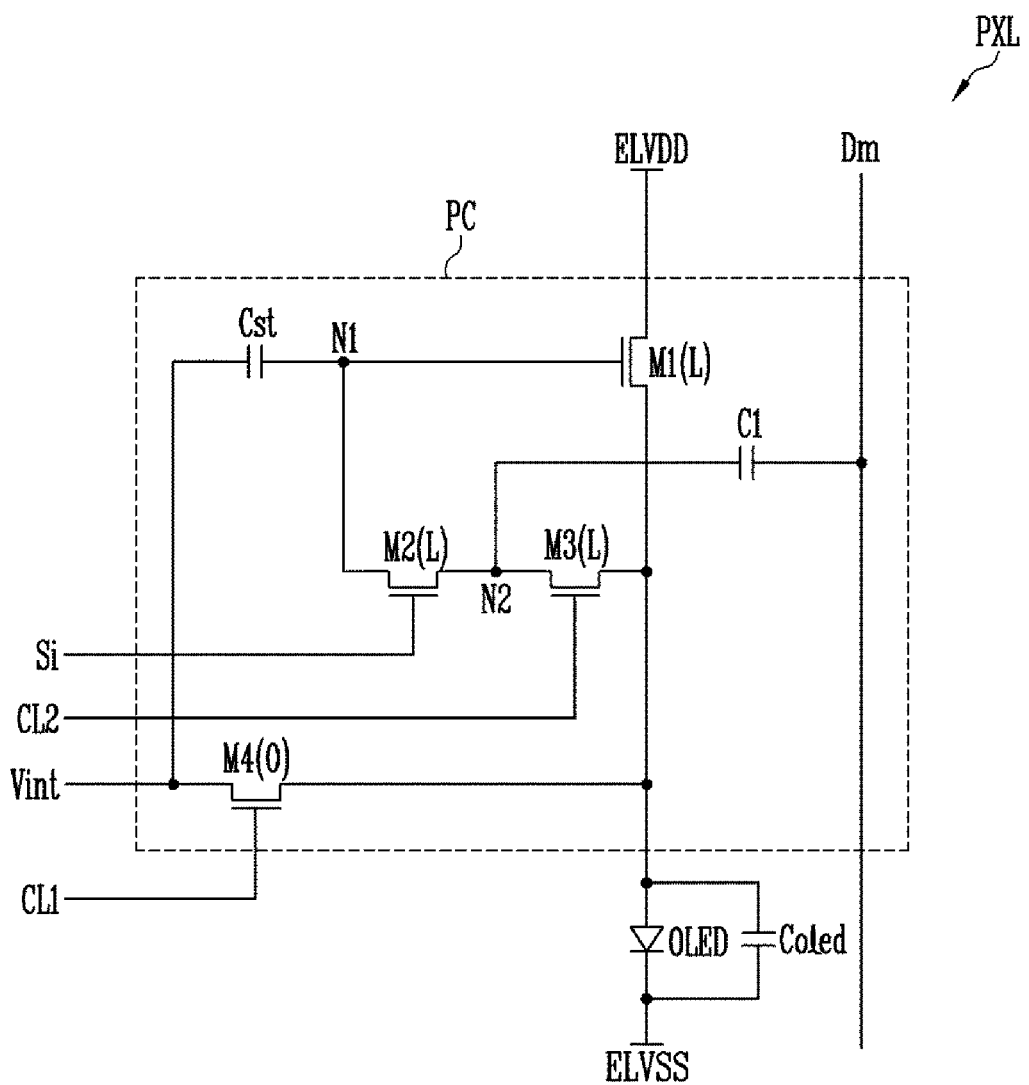

Referring to FIG. 11C, a first transistor M1(L), a second transistor M2(L), and a third transistor M3(L) may be formed as poly-silicon semiconductor transistors, and a fourth transistor M4(O) may be formed as an oxide semiconductor transistor.

Figure 11D:
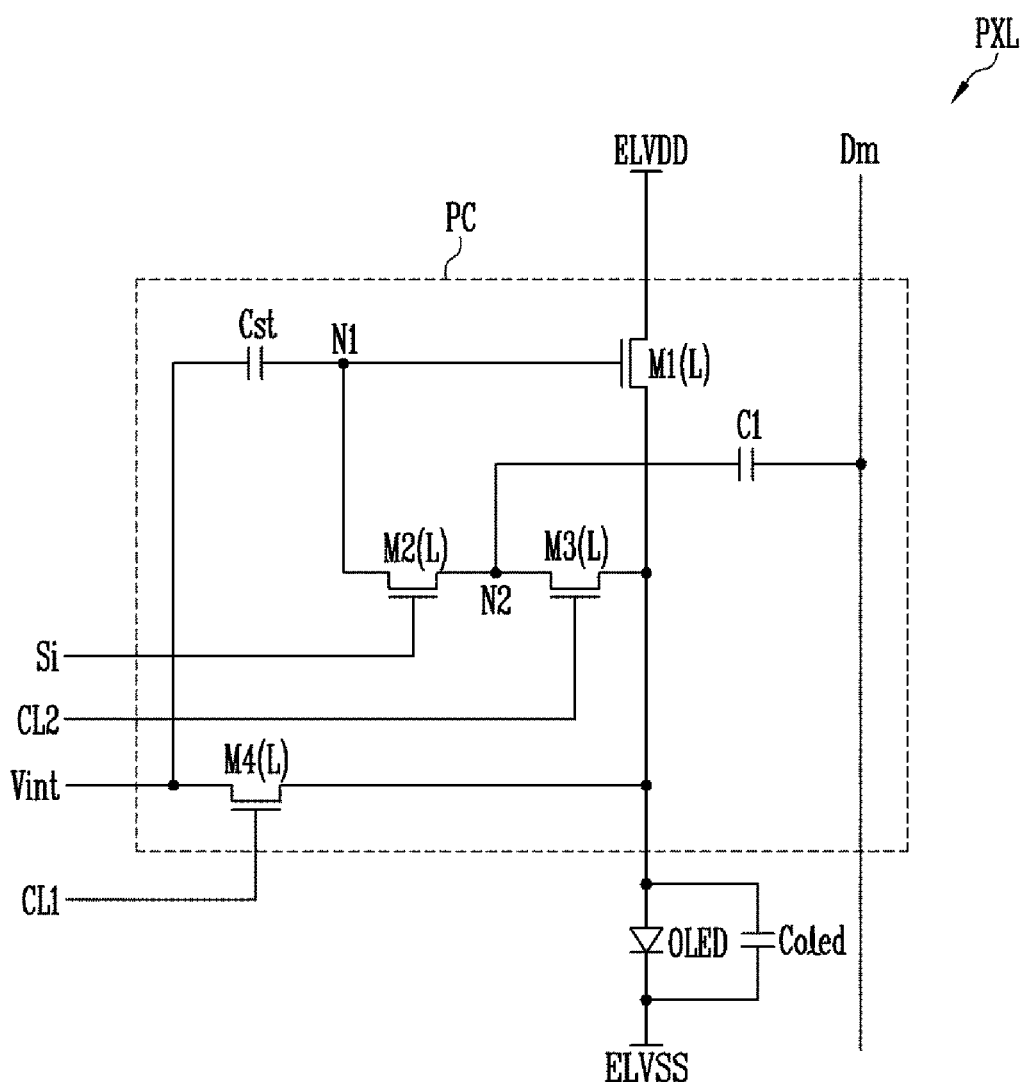

Referring to FIG. 11D, a first transistor M1(L), a second transistor M2(L), a third transistor M3(L), and a fourth transistor M4(L) may be formed as poly-silicon semiconductor transistors.

That is, in these other exemplary embodiments of the inventive concept, at least one transistor among the first to fourth transistors M1 to M4 may be formed as a poly-silicon semiconductor transistor. A ratio of oxide semiconductor transistors and/or poly-silicon semiconductor transistors, which are included in the pixel circuit PC, may be variously set by considering the resolution, size, etc. of a panel.

Figure 12:
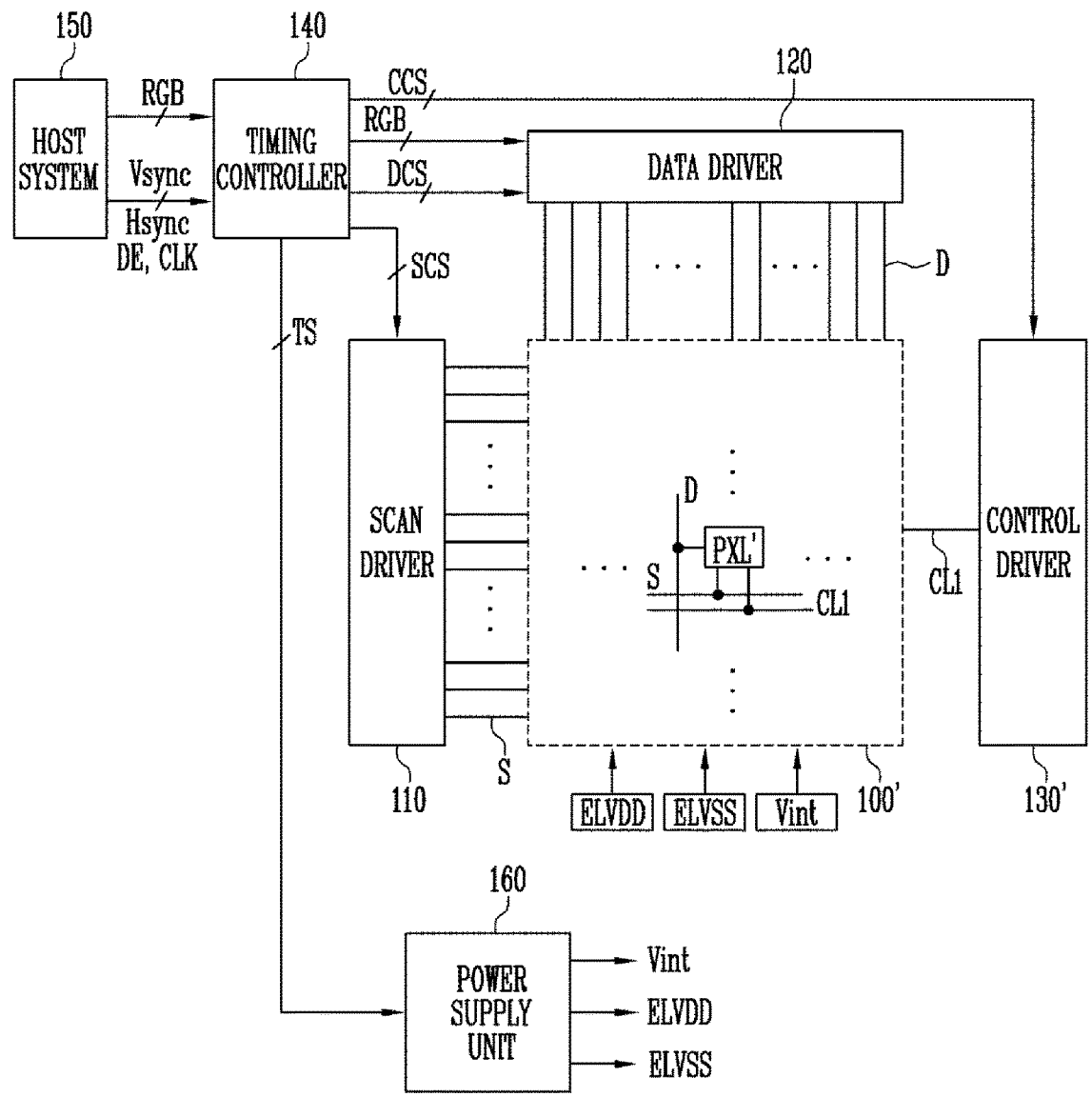
FIG. 12 is a diagram illustrating an organic light emitting display device according to another exemplary embodiment of the inventive concept.

FIG. 12 is a diagram illustrating an organic light emitting display device according to another exemplary embodiment of the inventive concept. In FIG. 12, components identical to those of FIG. 1 are designated by like reference numerals, and their detailed descriptions will be omitted.

Referring to FIG. 12, the organic light emitting display device according to the exemplary embodiment of the inventive concept includes a pixel unit 100', a scan driver 110, a data driver 120, a control driver 130', a timing controller 140, a host system 150, and a power supply unit 160.

The control driver 130' supplies a first control signal to a first control line CL1. For example, the control driver 130' may supply the first control signal to the first control line CL1 during an initialization period. If the first control signal is supplied to the first control line CL1, an anode electrode of the organic light emitting diode OLED and a gate electrode of a driving transistor, which are included in each of pixels PXL', are initialized.

The first control signal is set to the gate-on voltage such that transistors included in the pixels PXL' can be turned on. Additionally, the first control line CL1 is commonly coupled to the pixels PXL', and accordingly, the pixels PXL' can be driven in the simultaneous driving manner.

The pixel unit 100' includes pixels PXL' located to be coupled to data lines D, scan lines S, and the first control line CL1. The pixels PXL' are supplied with a first driving power source ELVDD, a second driving power source ELVSS, and an initialization power source Vint.

Each of the pixels PXL' is supplied with a data signal from the data line D during a programming period. The pixel PXL' supplied with the data signal controls the amount of current flowing from the first driving power source ELVDD to the second driving power source ELVSS via an organic light emitting diode (not shown) during a light emission period. At this time, the organic light emitting diode generates light with a predetermined luminance corresponding to the amount of the current. Each of the pixels PXL' may be coupled to two or more scan lines, corresponding to a circuit structure thereof.

Figure 13:
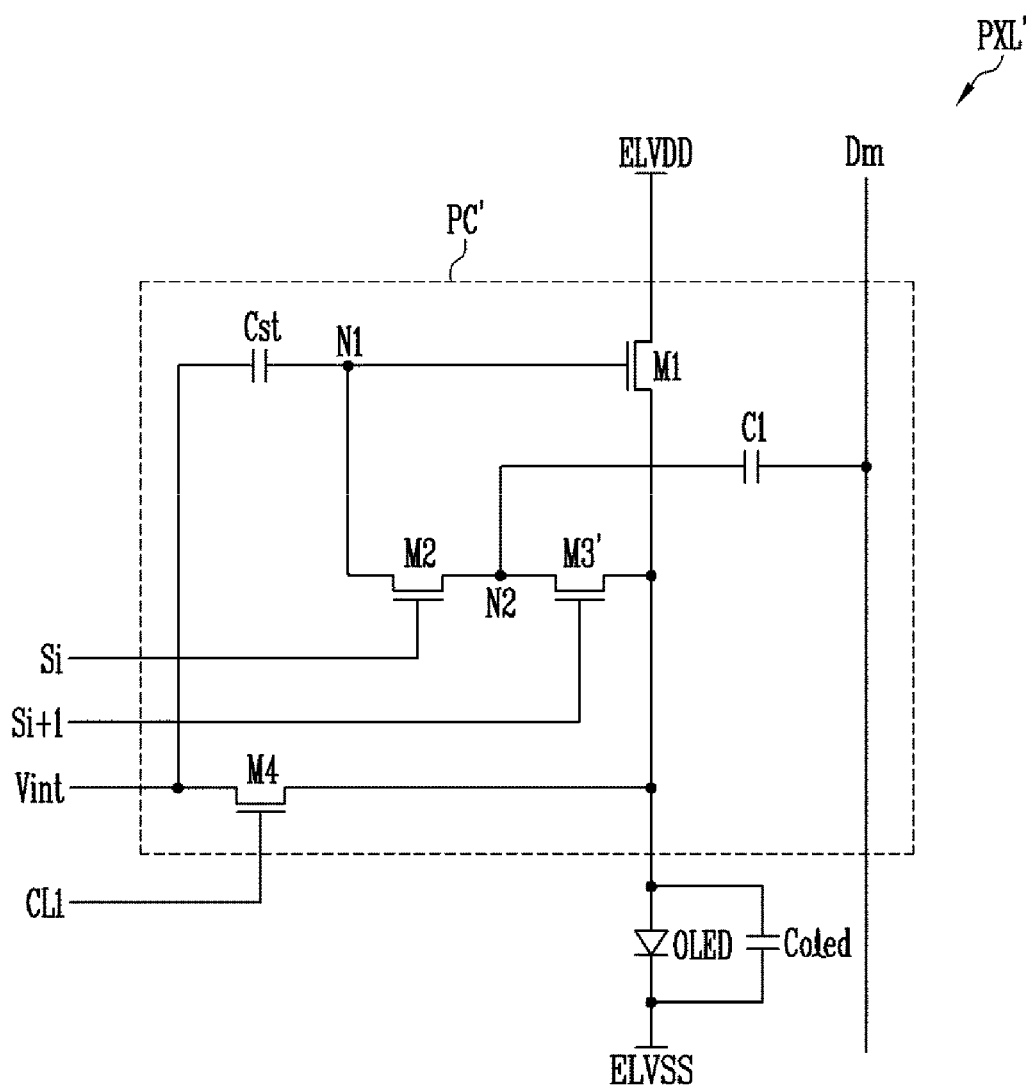
FIG. 13 is a diagram illustrating an exemplary embodiment of a pixel shown in FIG. 12.

FIG. 13 is a diagram illustrating an exemplary embodiment of a pixel shown in FIG. 12. For convenience of illustration, a pixel coupled to an ith scan line Si and an mth data line Dm is illustrated in FIG. 13.

Referring to FIG. 13, the pixel PXL' according to the exemplary embodiment of the inventive concept includes an organic light emitting diode OLED and a pixel circuit PC' for controlling the amount of current supplied to the organic light emitting diode OLED.

An anode electrode of the organic light emitting diode OLED is coupled to the pixel circuit PC', and a cathode electrode of the organic light emitting diode OLED is coupled to the second driving power source ELVSS. The organic light emitting diode OLED generates light with a predetermined luminance corresponding to the amount of current supplied from the pixel circuit PC' during the light emission period.

During the light emission period, the pixel circuit PC' controls the amount of current flowing from the first driving power source ELVDD to the second driving power source ELVSS via the organic light emitting diode OLED, corresponding to the data signal. To this end, the pixel circuit PC' includes first to fourth transistors M1, M2, M3', and M4, a storage capacitor Cst, and a first capacitor C1.

A first electrode of the first transistor (or driving transistor) M1 is coupled to the first driving power source ELVDD, and a second electrode of the first transistor M1 is coupled to the anode electrode of the organic light emitting diode OLED. In addition, a gate electrode of the first transistor M1 is coupled to a first node N1. The first transistor M1 controls the amount of current flowing from the first driving power source ELVDD to the second driving power source ELVSS via the organic light emitting diode OLED, corresponding to a voltage of the first node N1.

The second transistor M2 is coupled between the first node N1 and a second node N2. In addition, a gate electrode of the second transistor M2 is coupled to the ith scan line S1. The second transistor M2 is turned on when a scan signal is supplied to the ith scan line Si to allow the first node N1 and the second node N2 to be electrically coupled to each other.

The third transistor M3' is coupled between the second node N2 and the anode electrode of the organic light emitting diode OLED. In addition, a gate electrode of the third transistor M3' is coupled to an (i+1)th scan line Si+1. The third transistor M3' is turned on when the scan signal is supplied to the (i+1)th scan line Si+1 to allow the second node N2 and the anode electrode of the organic light emitting diode OLED to be electrically coupled to each other.

The fourth transistor M4 is coupled between the initialization power source Vint and the anode electrode of the organic light emitting diode OLED. In addition, a gate electrode of the fourth transistor M4 is coupled to the first control line CL1. The fourth transistor M4 is turned on when the first control signal is supplied to the first control line CL1. If the fourth transistor M4 is turned on, a first voltage V1 of the initialization power source Vint is supplied to the anode electrode of the organic light emitting diode OLED.

The storage capacitor Cst is coupled between the initialization power source Vint and the first node N1. The storage capacitor Cst stores voltages corresponding to the data signal and a threshold voltage of the first transistor M1.

The first capacitor C1 is coupled between the second node N2 and the data line Dm. The first capacitor C1 controls a voltage of the second node N2, corresponding to a voltage of the data line Dm.

FIG. 14 is a waveform diagram illustrating an exemplary embodiment of a driving method of the pixel shown in FIG. 13.

Referring to FIG. 14, one frame period 1F is divided into an initialization period, a threshold voltage compensation period, a programming period, and a light emission period.

During the initialization period, a first node N1 and the anode electrode of the organic light emitting diode OLED are initialized to the first voltage V1 by the initialization power source Vint.

During the threshold voltage compensation period, a voltage corresponding to the threshold voltage of the first transistor M1 is stored in the storage capacitor Cst.

During the programming period, a voltage corresponding to the data signal is stored in the storage capacitor Cst.

During the light emission period, the organic light emitting diode OLED generates light with a predetermined luminance corresponding to the amount of current supplied from the pixel circuit PC'.

An operating process of the pixel PXL' will be described. First, the scan signal is supplied to all of the scan lines S during the initialization period. In addition, the first control signal is supplied to the first control line CL1 during the initialization period.

If the first control signal is supplied to the first control line CL1, the fourth transistor M4 included in each of the pixels PXL' is turned on. If the fourth transistor M4 is turned on, the first voltage V1 of the initialization power source Vint is supplied to the anode electrode of the organic light emitting diode OLED.

If the scan signal is supplied to the scan lines S, the second transistor M2 and the third transistor M3', which are included in each of the pixels PXL', are turned on. If the second transistor M2 and the third transistor M3' are turned on, the first node N1 and the anode electrode of the organic light emitting diode OLED are electrically coupled to each other. Then, the first voltage V1 of the initialization power source Vint is supplied to the first node N1. That is, during the initialization period, the anode electrode of the organic light emitting diode OLED and the first node N1, which are included in each of the pixels PXL', are initialized to the first voltage V1 of the initialization power source Vint. Here, the first voltage V1 may be set such that the organic light emitting diode OLED does not emit light.

The supply of the first control signal to the first control line CL1 is stopped during the threshold voltage compensation period. If the supply of the first control signal to the first control line CL1 is stopped, the fourth transistor M4 is turned off. In addition, the first driving power source ELVDD is set to a third voltage V3 during the threshold voltage compensation period. Here, the third voltage V3 is set to a voltage lower than the first voltage V1.

The scan signal is supplied to the scan lines S during the threshold voltage compensation period, and accordingly, the second transistor M2 and the third transistor M3', which are included in each of the pixels PXL', maintain a turn-on state. If the second transistor M2 and the third transistor M3' are turned on, the first transistor M1 is diode-coupled such that current can flow from the anode electrode of the organic light emitting diode OLED to the first driving power source ELVDD. Then, the current is supplied from the first node N1 and the anode electrode of the organic light emitting diode OLED, which are set to the first voltage V1, the first driving power source ELVDD set to the third voltage V3.

At this time, since the first transistor M1 is diode-coupled as described above, the voltage of the first node N1 is set to a voltage obtained by adding an absolute value of the threshold voltage of the first transistor M1 to the third voltage V3 of the first driving power source ELVDD. That is, the voltage corresponding to the threshold voltage of the first transistor M1 is applied to the first node N1 during the threshold voltage compensation period. The voltage corresponding to the threshold voltage of the first transistor M1, which is applied to the first node N1, is stored in the storage capacitor Cst during the threshold voltage compensation period.

The scan signal is simultaneously supplied to all of the scan lines S during the initialization period and the threshold voltage compensation period. Therefore, the voltage corresponding to the threshold voltage of the first transistor M1 coupled to the storage capacitor Cst included in each of the pixels PXL' is stored in the storage capacitor Cst during the initialization period and the threshold voltage compensation period.

The scan signal is sequentially supplied to the scan lines S during the programming period. In addition, the first driving power source ELVDD is set to a fourth voltage V4 higher than the third voltage V3.

If the scan signal is supplied to the ith scan line Si, the second transistor M2 coupled to the ith scan line Si is turned on. If the second transistor M2 is turned on, the first node N1 and the second node N2 are electrically coupled to each other.

The data signal is supplied to the data line Dm to be synchronized with the ith scan line Si. If the data signal is supplied to the data line Dm, voltages of the second node N2 and the first node N1 are changed by coupling of the first capacitor C1. That is, if the second transistor M2 is turned on, the voltage of the first node N1 is set corresponding to the voltage of the data signal. Therefore, during the programming period, the voltages corresponding to the threshold voltage of the first transistor M1 and the data signal are stored in the storage capacitor Cst included in each of the pixels PXL'.

In other words, the scan signal is sequentially supplied to the scan lines S during the programming period. Then, the second transistors M2 included in the respective pixels PXL' are turned on in units of horizontal lines, and accordingly, a voltage corresponding to a desired data signal can be stored in each of the pixels PXL'.

If the scan signal is supplied to the (i+1)th scan line Si+1, the third transistor M3' coupled to the (i+1)th scan line Si+1 is turned on. At this time, since the second transistor M2 is set to a turn-off state, the first node N1 stably maintains a voltage charged in a previous period.

The initialization power source Vint is set to a second voltage V2 during the light emission Vint. If the initialization power source Vint is set to the second voltage V2, i.e., if the initialization power source Vint is increased from the first voltage V1 to the second voltage V2, the voltage of the first node N1 is increased by coupling of the storage capacitor Cst. At this time, the first transistor M1 controls the amount of current flowing from the first driving power source ELVDD set to a fourth voltage V4 to the second driving power source ELVDD via the organic light emitting diode OLED, corresponding to the voltage of the first node N1. To this end, the fourth voltage V4 and the second voltage V2 may be set such that current can be supplied to the pixel PXL'.

As described above, each of the pixels PXL' according to the exemplary embodiment of the inventive concept generates light with a predetermined luminance by passing through the initialization period, the threshold voltage compensation period, the programming period, and the light emission period during the one frame period 1F.

In an exemplary embodiment of the inventive concept, the first capacitor C1 is coupled between the data line Dm and the second node N2, and accordingly, an image with uniform luminance can be displayed from the pixel unit 100'. That is, a voltage of an organic capacitor Coled is not changed corresponding to a change in voltage of the data line Dm, and accordingly, an image with uniform luminance can be displayed. Additionally, since the second node N2 is not coupled to a separate capacitor (i.e., since the voltage of the second node N2 is not maintained), the voltage of the second node N2 has no influence on the voltage of the first node N1.

In FIG. 13, it has been illustrated that the transistors M1 to M4 are formed as N-type transistors (e.g., NMOS transistors), but the inventive concept is not limited thereto. For example, at least one of the second transistor M2, the third transistor M3', and the fourth transistor M4 may be formed as a P-type transistor (e.g., a PMOS transistor).

Figure 15A:
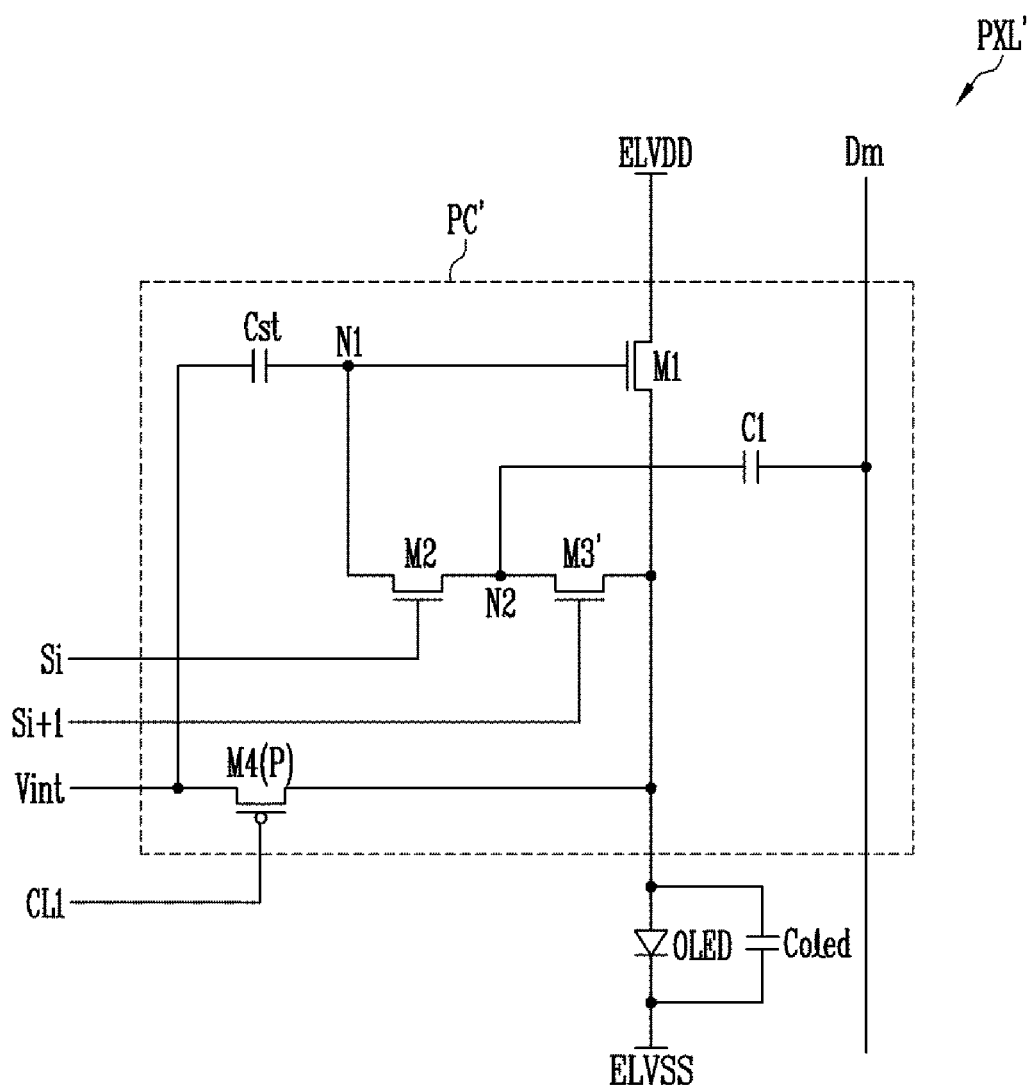
FIG. 15A and FIG. 15B are diagrams illustrating other exemplary embodiments of the pixel shown in FIG. 13.
Figure 15B:
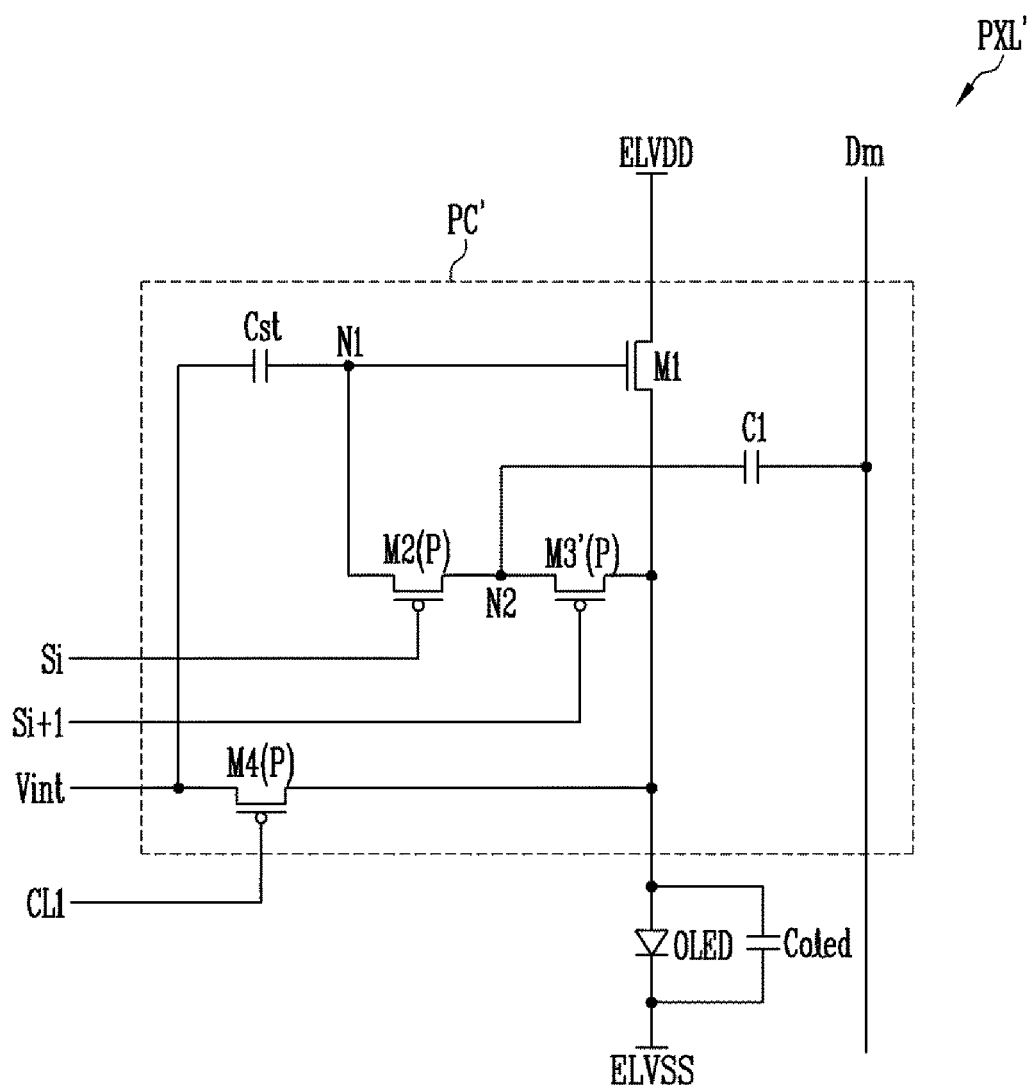

FIGS. 15A and 15B are diagrams illustrating other exemplary embodiments of the pixel shown in FIG. 13. The pixels of FIGS. 15A and 15B are driven by the same driving method as the pixel of FIG. 13, and therefore, a detailed description of the driving method will be omitted.

Referring to FIGS. 15A and 15B, each of the pixels PXL' according to the other exemplary embodiments of the inventive concept includes an organic light emitting diode OLED and a pixel circuit PC' for controlling the amount of current supplied to the organic light emitting diode OLED.

An anode electrode of the organic light emitting diode OLED is coupled to the pixel circuit PC', and a cathode electrode of the organic light emitting diode OLED is coupled to the second driving power source ELVSS. The organic light emitting diode OLED generates light with a predetermined luminance corresponding to the amount of current supplied from the pixel circuit PC' during the light emission period.

During the light emission period, the pixel circuit PC' controls the amount of current flowing from the first driving power source ELVDD to the second driving power source ELVSS via the organic light emitting diode OLED, corresponding to the data signal.

Referring to FIG. 15A, the pixel circuit PC' includes a first transistor M1, a second transistor M2, a third transistor M3', and a fourth transistor M4(P).

The fourth transistor M4(P) is coupled between the initialization power source Vint and the anode electrode of the organic light emitting diode OLED. In addition, a gate electrode of the fourth transistor M4(P) is coupled to the first control line CL1. The fourth transistor M4(P) is turned on when the first control signal is supplied to the first control line CL1. If the fourth transistor M4(P) is turned on, the first voltage of the initialization power source Vint is supplied to the anode electrode of the organic light emitting diode OLED.

In FIG. 15A, the other components and operating process of the pixel PXL' are set identically to those of FIG. 13, except that the fourth transistor M4(P) is formed as a P-type transistor. However, when the fourth transistor M4(P) is formed as the P-type transistor, the polarity of the first control signal supplied to the first control line CL1 is reversed. That is, the first control signal may be set to a low voltage to have the gate-on voltage.

Referring to FIG. 15B, the pixel circuit PC' includes a first transistor M1, a second transistor M2(P), a third transistor M3'(P), and a fourth transistor M4(P).

The second transistor M2(P) is coupled between the first node N1 and the second node N2. In addition, a gate electrode of the second transistor M2(P) is coupled to the ith scan line Si. The second transistor M2(P) is turned on when the scan signal is supplied to the ith scan line Si to allow the first node N1 and the second node N2 to be electrically coupled to each other.

The third transistor M3'(P) is coupled between the second node N2 and the anode electrode of the organic light emitting diode OLED. In addition, a gate electrode of the third transistor M3'(P) is coupled to the (i+1)th scan line Si+1. The third transistor M3'(P) is turned on when the scan signal is supplied to the (i+1)th scan line Si+1 to allow the second node N2 and the anode electrode of the organic light emitting diode OLED to be electrically coupled to each other.

The fourth transistor M4(P) is coupled between the initialization power source Vint and the anode electrode of the organic light emitting diode OLED. In addition, a gate electrode of the fourth transistor M4(P) is coupled to the first control line CL1. The fourth transistor M4(P) is turned on when the first control signal is supplied to the first control line CL1. If the fourth transistor M4(P) is turned on, the first voltage V1 of the initialization power source Vint is supplied to the anode electrode of the organic light emitting diode OLED.

In FIG. 15B, the other components and operating process of the pixel PXL' are set identically to those of FIG. 13, except that the second transistor M2(P), the third transistor M3'(P), and the fourth transistor M4(P) are formed as P-type transistors. However, when the second transistor M2(P) and the third transistor M3'(P) are formed as the P-type transistors, the polarity of the scan signal is reversed. That is, the scan signal may be set to a low voltage to have the gate-on voltage.

Similarly, when the fourth transistor M4(P) is formed as the P-type transistor, the polarity of the first control signal supplied to the first control line CL1 is reversed. That is, the first control signal may be set to a low voltage to have the gate-on voltage.

In the above-described FIG. 13, it has been illustrated that the transistors M1 to M4 are formed as the N-type transistors. Here, at least one of the transistors M1 to M4 may be formed as an oxide semiconductor transistor. In addition, at least one of the transistors M1 to M4 may be formed as a poly-silicon semiconductor transistor.

FIGS. 16A to 16D are diagrams illustrating still other exemplary embodiments of the pixel shown in FIG. 13. The pixels of FIGS. 16A to 16D are driven by the same driving method as the pixel of FIG. 13, and therefore, a detailed description of the driving method will be omitted.

Referring to FIGS. 16A to 16D, each of the pixels PXL' according to these other exemplary embodiments of the inventive concept includes an organic light emitting diode OLED and a pixel circuit PC' for controlling the amount of current supplied to the organic light emitting diode OLED.

An anode electrode of the organic light emitting diode OLED is coupled to the pixel circuit PC', and a cathode electrode of the organic light emitting diode OLED is coupled to the second driving power source ELVSS. The organic light emitting diode OLED generates light with a predetermined luminance corresponding to the amount of current supplied from the pixel circuit PC' during the light emission period.

During the light emission period, the pixel circuit PC' controls the amount of current flowing from the first driving power source ELVDD to the second driving power source ELVSS via the organic light emitting diode OLED, corresponding to the data signal. To this end, the pixel circuit PC' includes four transistors.

Figure 16A:
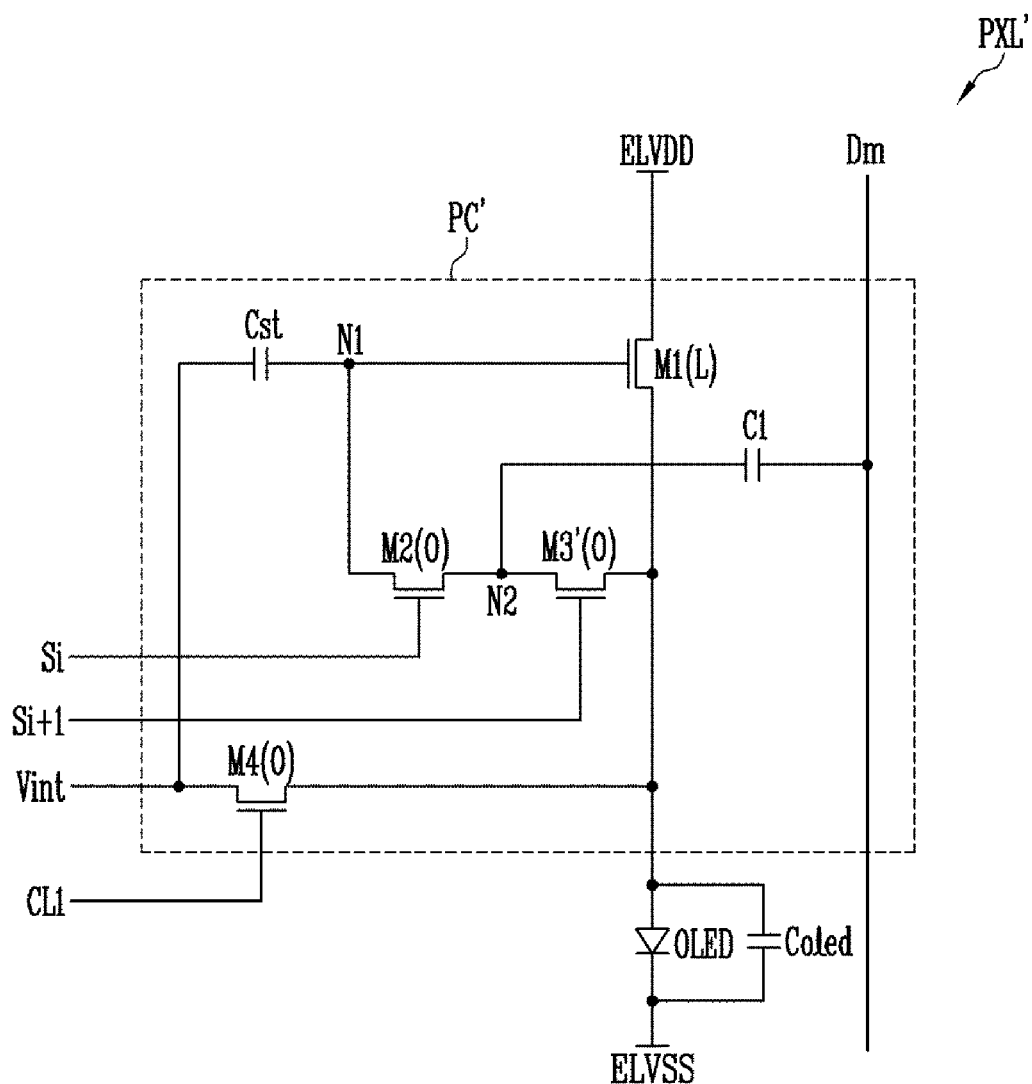
FIG. 16A, FIG. 16B, FIG. 16C, and FIG. 16D are diagrams illustrating still other exemplary embodiments of the pixel shown in FIG. 13.

Referring to FIG. 16A, a first transistor M1(L) may be formed as a poly-silicon semiconductor transistor, and a second transistor M2(O), a third transistor M3'(O), and a fourth transistor M4(O) may be formed as oxide semiconductor transistors.

Figure 16B:
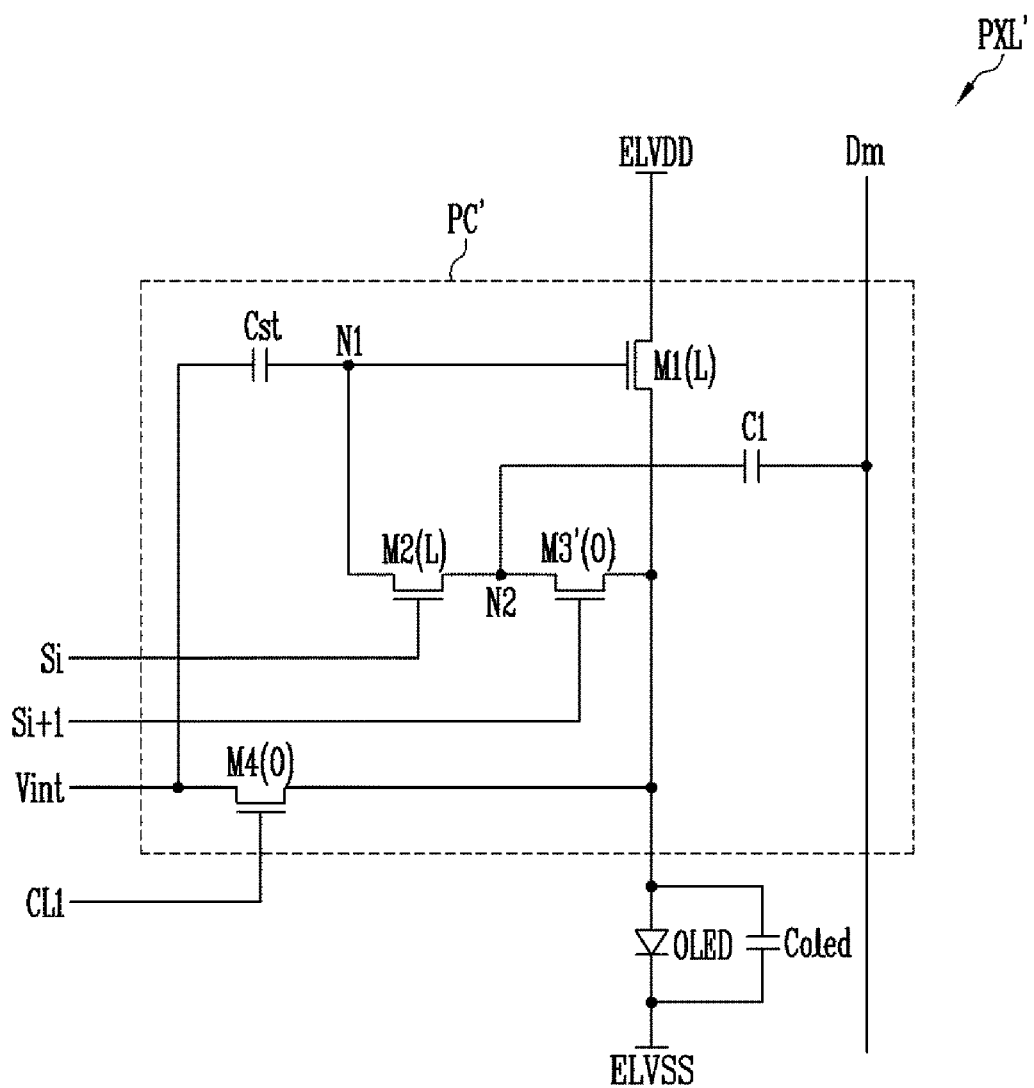

Referring to FIG. 16B, a first transistor M1(L) and a second transistor M2(L) may be formed as poly-silicon semiconductor transistors, and a third transistor M3'(O) and a fourth transistor M4(O) may be formed as oxide semiconductor transistors.

Figure 16C:
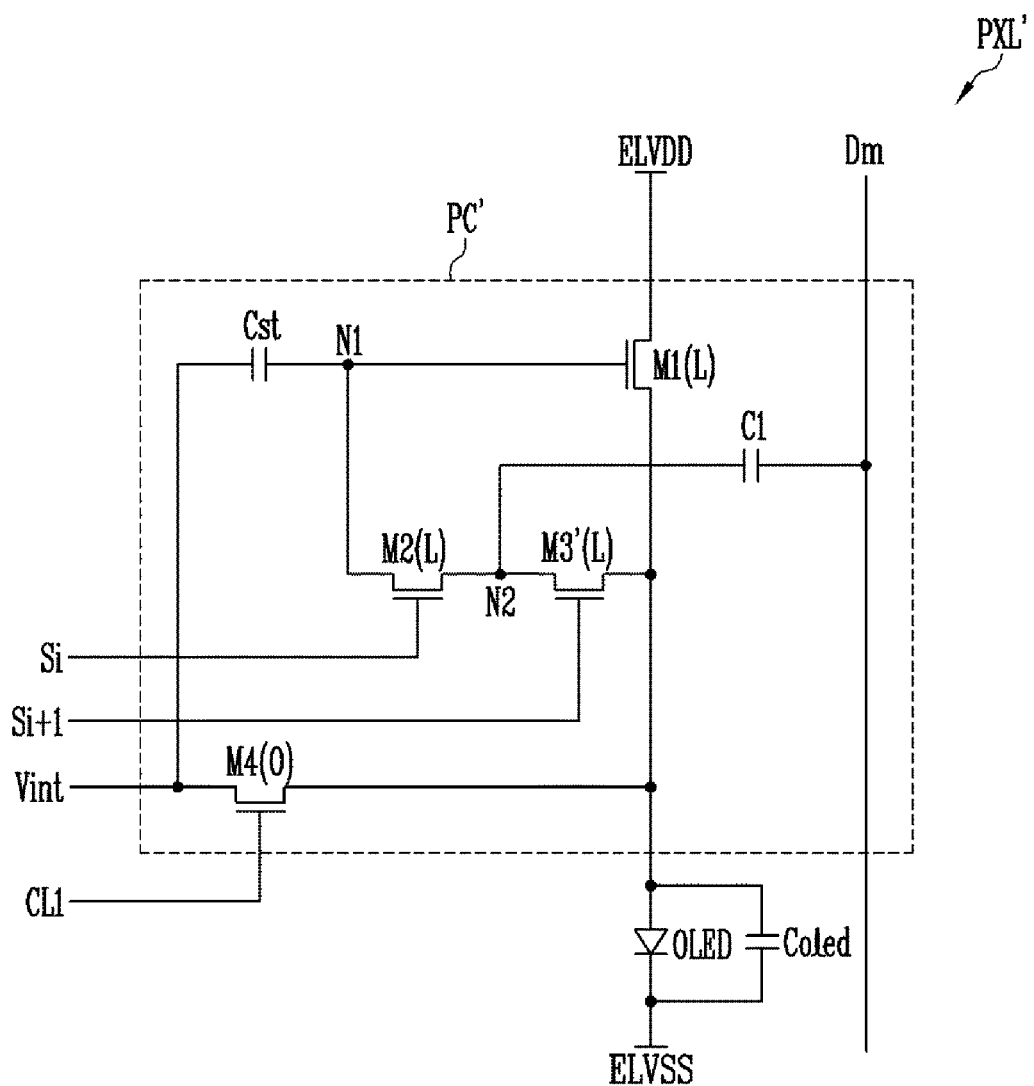

Referring to FIG. 16C, a first transistor M1(L), a second transistor M2(L), and a third transistor M3'(L) may be formed as poly-silicon semiconductor transistors, and a fourth transistor M4(O) may be formed as an oxide semiconductor transistor.

Figure 16D:
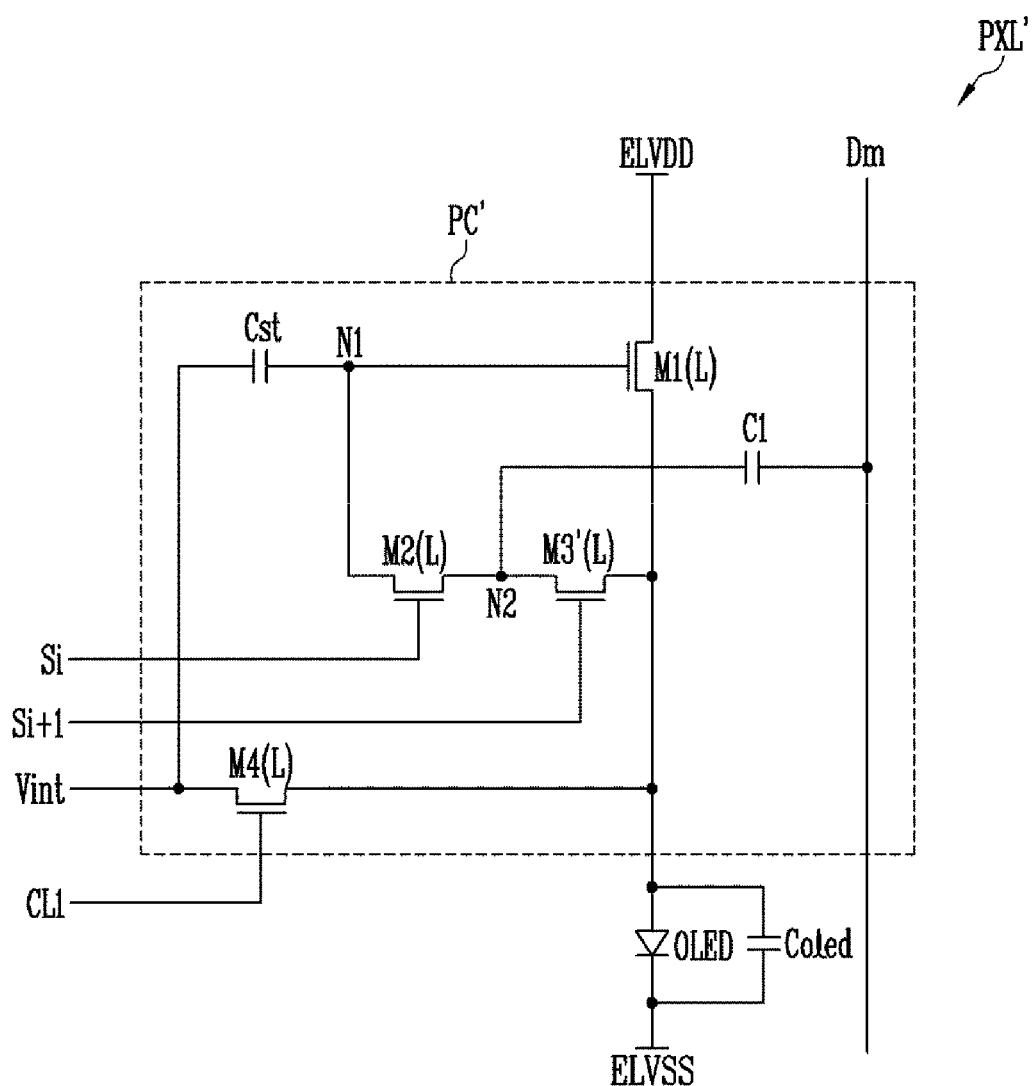

Referring to FIG. 16D, a first transistor M1(L), a second transistor M2(L), a third transistor M3'(L), and a fourth transistor M4(L) may be formed as poly-silicon semiconductor transistors.

Figure 17:
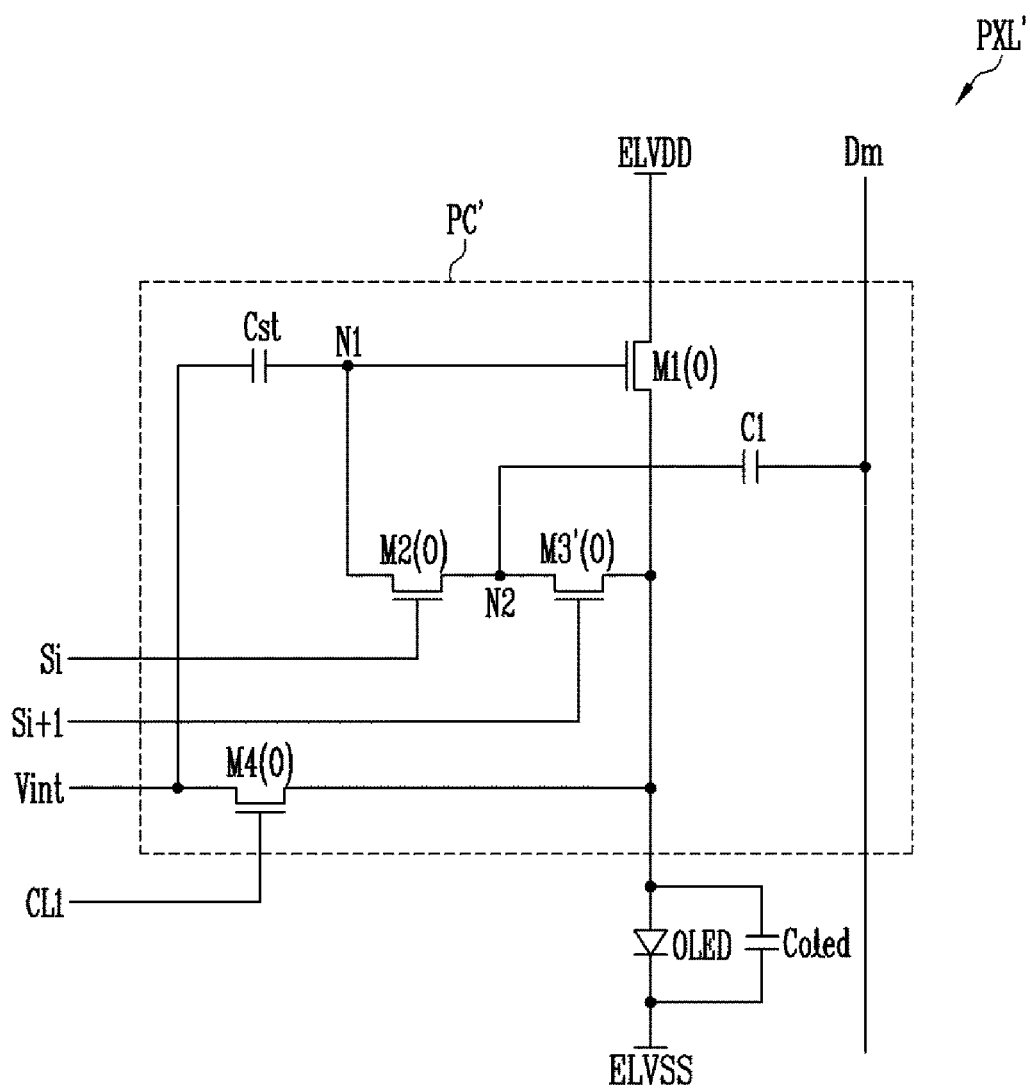
FIG. 17 is a diagram illustrating still another exemplary embodiment of the pixel shown in FIG. 13.

That is, in these other exemplary embodiments, at least one transistor among the first to fourth transistors M1 to M4 may be formed as a poly-silicon semiconductor transistor. Similarly, in these other exemplary embodiments, at least one transistor among the first to fourth transistors M1 to M4 may be formed as an oxide semiconductor transistor. For example, as shown in FIG. 17, first to fourth transistors M1(O), M2(O), M3'(O), and M4(O) may be formed as oxide semiconductor transistors.

A ratio of oxide semiconductor transistors and/or poly-silicon semiconductor transistors, which are included in the pixel circuit PC', may be variously set by considering the resolution, size, etc. of a panel.

Figure 18:
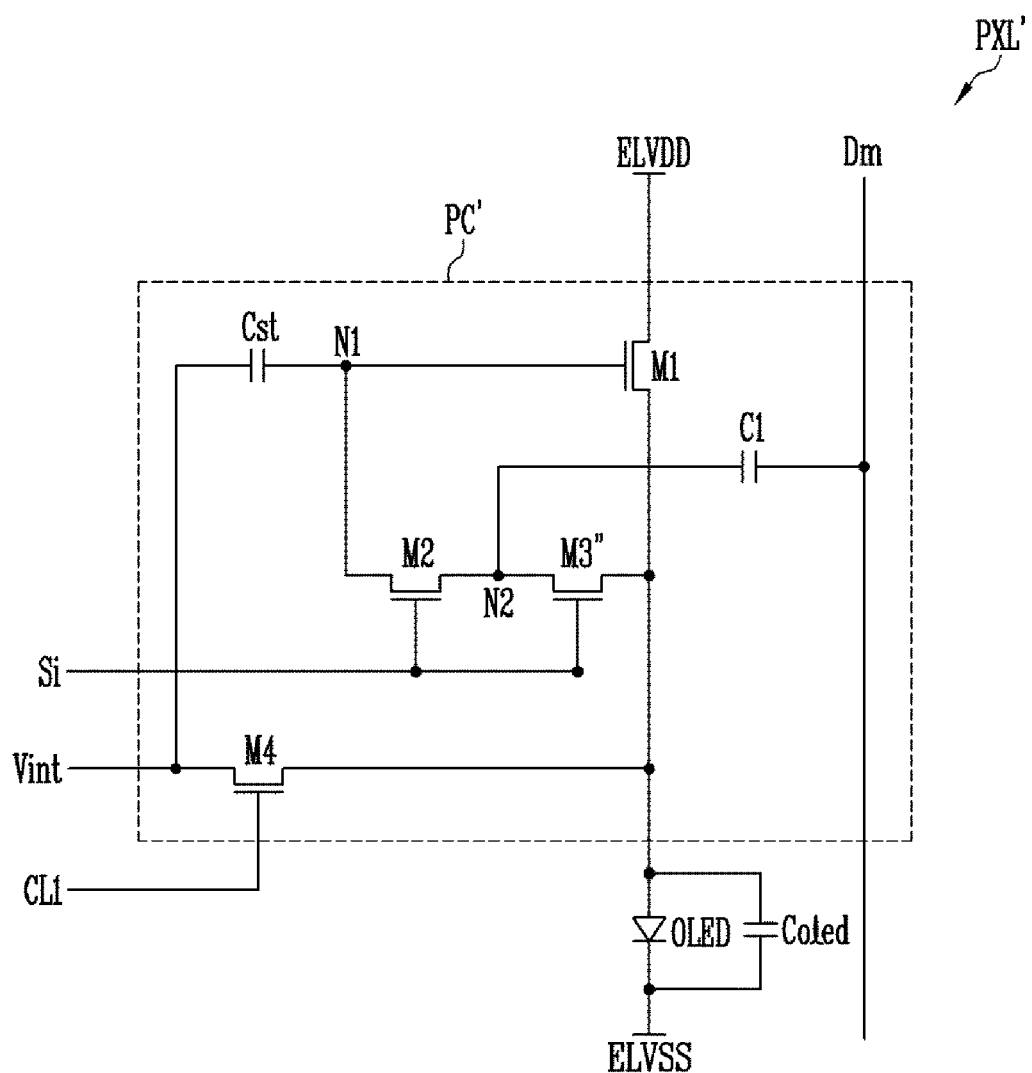
FIG. 18 is a diagram illustrating still another exemplary embodiment of the pixel shown in FIG. 13.

FIG. 18 is a diagram illustrating still another exemplary embodiment of the pixel shown in FIG. 13. In FIG. 18, components identical to those of FIG. 13 are designated by like reference numerals, and their detailed descriptions will be omitted.

Referring to FIG. 18, the pixel PXL' according to the exemplary embodiment of the inventive concept includes an organic light emitting diode OLED and a pixel circuit PC' for controlling the amount of current supplied to the organic light emitting diode OLED.

An anode electrode of the organic light emitting diode OLED is coupled to the pixel circuit PC', and a cathode electrode of the organic light emitting diode OLED is coupled to the second driving power source ELVSS. The organic light emitting diode OLED generates light with a predetermined luminance corresponding to the amount of current supplied from the pixel circuit PC' during the light emission period.

During the light emission period, the pixel circuit PC' controls the amount of current flowing from the first driving power source ELVDD to the second driving power source ELVSS via the organic light emitting diode OLED, corresponding to the data signal. To this end, the pixel circuit PC' includes first to fourth transistors M1, M2, M3", and M4, a storage capacitor Cst, and a first capacitor C1.

The third transistor M3" is coupled between the second node N2 and the anode electrode of the organic light emitting diode OLED. In addition, a gate electrode of the third transistor M3" is coupled to the ith scan line Si. The third transistor M3" is turned on when the scan signal is supplied to the ith scan line Si to allow the second node N2 and the anode electrode of the organic light emitting diode OLED to be electrically coupled to each other.

FIG. 19 is a waveform diagram illustrating an exemplary embodiment of a driving method of the pixel shown in FIG. 18.

Referring to FIG. 19, one frame period 1F is divided into an initialization period, a threshold voltage compensation period, a programming period, and a light emission period.

During the initialization period, the first node N1 and the anode electrode of the organic light emitting diode OLED are initialized to the first voltage V1 by the initialization power source Vint.

During the threshold voltage compensation period, a voltage corresponding to the threshold voltage of the first transistor M1 is stored in the storage capacitor Cst.

During the programming period, a voltage corresponding to the data signal is stored in the storage capacitor Cst.

During the light emission period, the organic light emitting diode OLED generates light with a predetermined luminance corresponding to the amount of current supplied from the pixel circuit PC'.

An operating process of the pixel PXL' will be described. First, the scan signal is supplied to all of the scan lines S during the initialization period. In addition, the first control signal is supplied to the first control line CL1 during the initialization period.

If the first control signal is supplied to the first control line CL1, the fourth transistor M4 included in each of the pixels PXL' is turned on. If the fourth transistor M4 is turned on, the first voltage V1 of the initialization power source Vint is supplied to the anode electrode of the organic light emitting diode OLED.

If the scan signal is supplied to the scan lines S, the second transistor M2 and the third transistor M3", which are included in each of the pixels PXL', are turned on. If the second transistor M2 and the third transistor M3" are turned on, the first node N1 and the anode electrode of the organic light emitting diode OLED are electrically coupled to each other. Then, the first voltage V1 of the initialization power source Vint is supplied to the first node N1. That is, during the initialization period, the anode electrode of the organic light emitting diode OLED and the first node N1, which are included in each of the pixels PXL', are initialized to the first voltage V1 of the initialization power source Vint.

The supply of the first control signal to the first control line CL1 is stopped during the threshold voltage compensation period. If the supply of the first control signal to the first control line CL1 is stopped, the fourth transistor M4 is turned off. In addition, the first driving power source ELVDD is set to a third voltage V3 during the threshold voltage compensation period.

The scan signal is supplied to the scan lines S during the threshold voltage compensation period, and accordingly, the second transistor M2 and the third transistor M3", which are included in each of the pixels PXL', maintain the turn-on state. If the second transistor M2 and the third transistor M3" are turned on, the first transistor M1 is diode-coupled such that current can flow from the anode electrode of the organic light emitting diode OLED to the first driving power source ELVDD. Then, the current is supplied from the first node N1 and the anode electrode of the organic light emitting diode OLED, which are set to the first voltage V1, to the first driving power source ELVDD set to the third voltage V3.

At this time, since the first transistor M1 is diode-coupled as described above, the voltage of the first node N1 is set to a voltage obtained by adding an absolute value of the threshold voltage of the first transistor M1 to the third voltage V3 of the first driving power source ELVDD. That is, the voltage corresponding to the threshold voltage of the first transistor M1 is applied to the first node N1 during the threshold voltage compensation period. The voltage corresponding to the threshold voltage of the first transistor M1, which is applied to the first node N1, is stored in the storage capacitor Cst during the threshold voltage compensation period.

The scan signal is simultaneously supplied to all of the scan lines S during the initialization period and the threshold voltage compensation period. Therefore, the voltage corresponding to the threshold voltage of the first transistor M1 coupled to the storage capacitor Cst included in each of the pixels PXL' is stored in the storage capacitor Cst during the initialization period and the threshold voltage compensation period.

The scan signal is sequentially supplied to the scan lines S during the programming period. In addition, the first driving power source ELVDD is set to a fourth voltage V4 higher than the third voltage V3.

If the scan signal is supplied to the ith scan line Si, the second transistor M2 and the third transistor M3", which are coupled to the ith scan line Si, are turned on. If the second transistor M2 is turned on, the first node N1 and the second node N2 are electrically coupled to each other. If the third transistor M3" is turned on, the second node N2 and the anode electrode of the organic light emitting diode OLED are electrically coupled to each other.

The data signal is supplied to the data line Dm to be synchronized with the ith scan line Si. If the data signal is supplied to the data line Dm, voltages of the second node N2 and the first node N1 are changed by coupling of the first capacitor C1. That is, if the second transistor M2 is turned on, the voltage of the first node N1 is set corresponding to the voltage of the data signal. Therefore, during the programming period, the voltages corresponding to the threshold voltage of the first transistor M1 and the data signal are stored in the storage capacitor Cst included in each of the pixels PXL'.

In other words, the scan signal is sequentially supplied to the scan lines S during the programming period. Then, the second transistors M2 included in the respective pixels PXL's are turned on in units of horizontal lines, and accordingly, a voltage corresponding to a desired data signal can be stored in each of the pixels PXL'.

The initialization power source Vint is set to a second voltage V2 during the light emission period. If the initialization power source Vint is set to the second voltage V2, i.e., if the initialization power source Vint is increased from the first voltage V1 to the second voltage V2, the voltage of the first node N1 is increased by coupling of the storage capacitor Cst. At this time, the first transistor M1 controls the amount of current flowing from the first driving power source ELVDD set to a fourth voltage V4 to the second driving power source ELVDD via the organic light emitting diode OLED, corresponding to the voltage of the first node N1. To this end, the fourth voltage V4 and the second voltage V2 may be set such that current can be supplied to the pixel PXL'.

As described above, each of the pixels PXL' according to the exemplary embodiment of the inventive concept generates light with a predetermined luminance by passing through the initialization period, the threshold voltage compensation period, the programming period, and the light emission period during the one frame period 1F.

In an exemplary embodiment of the inventive concept, the first capacitor C1 is coupled between the data line Dm and the second node N2, and accordingly, an image with uniform luminance can be displayed from the pixel unit 100'. That is, a voltage of an organic capacitor Coled is not changed corresponding to a change in voltage of the data line Dm, and accordingly, an image with uniform luminance can be displayed. Additionally, since the second node N2 is not coupled to a separate capacitor (i.e., since the voltage of the second node N2 is not maintained), the voltage of the second node N2 has no influence on the voltage of the first node N1.

In FIG. 18, it has been illustrated that the transistors M1, M2, M3", and M4 are formed as N-type transistors (e.g., NMOS transistors), but the inventive concept is not limited thereto. For example, at least one of the second transistor M2, the third transistor M3", and the fourth transistor M4 may be formed as a P-type transistor (e.g., a PMOS transistor).

Figure 20A:
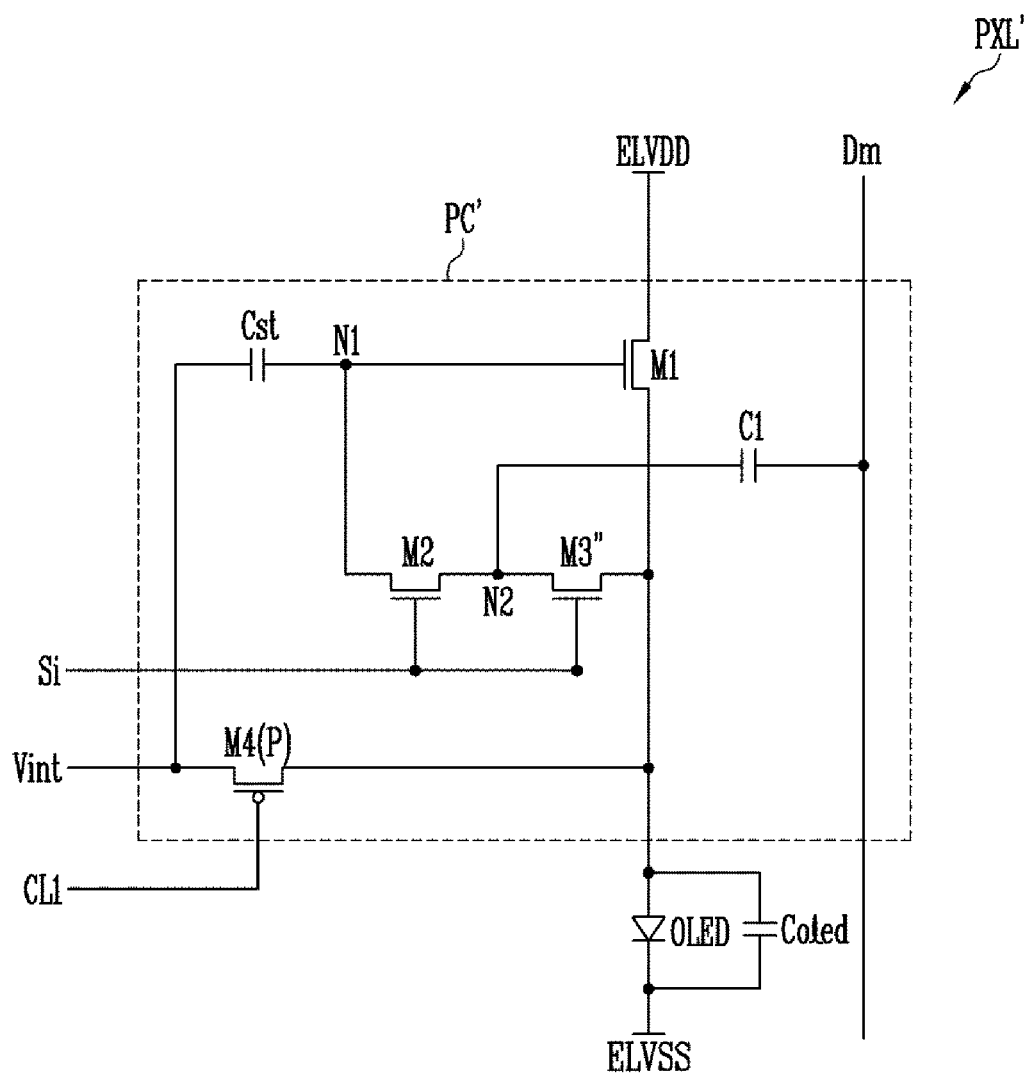
FIG. 20A and FIG. 20B are diagrams illustrating still other exemplary embodiments of the pixel shown in FIG. 13.
Figure 20B:
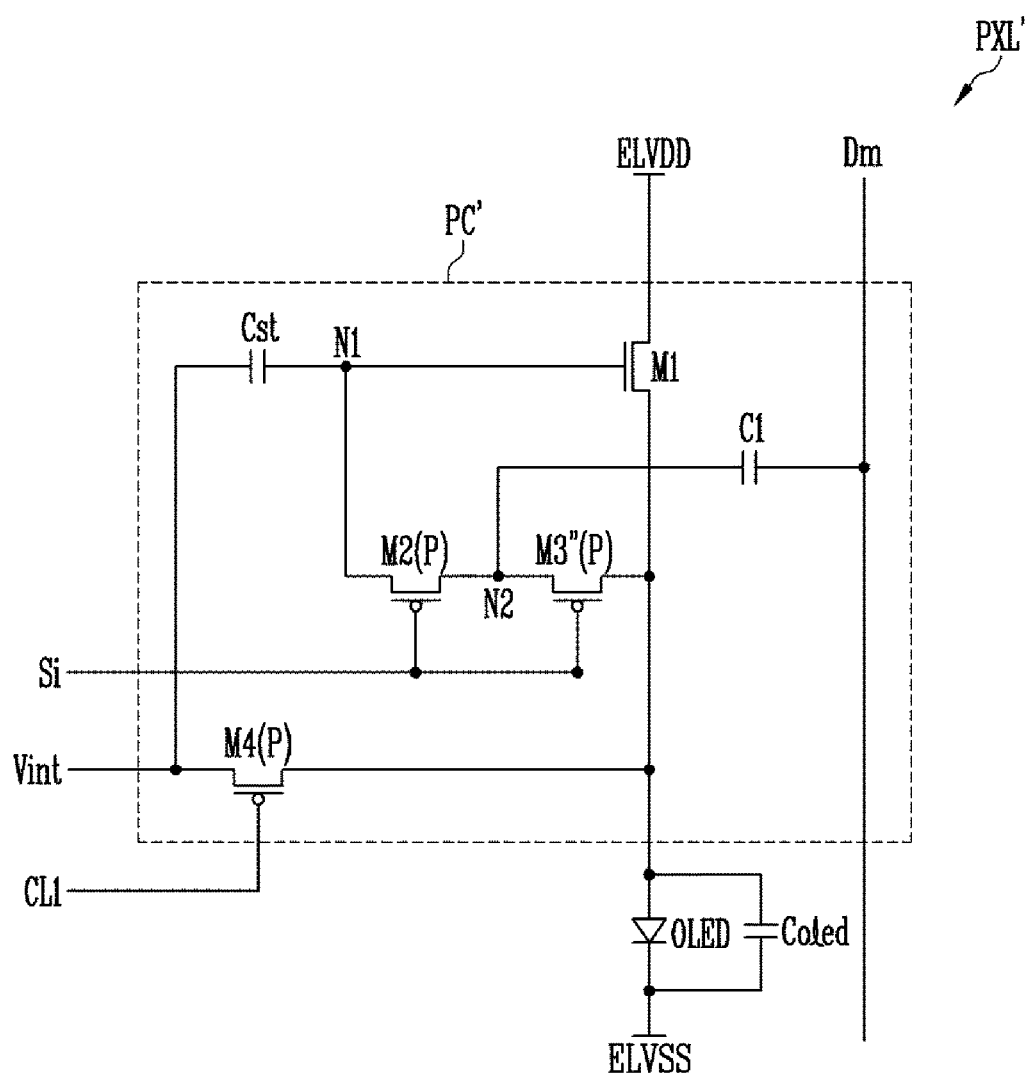

FIGS. 20A and 20B are diagrams illustrating still other exemplary embodiments of the pixel shown in FIG. 13. The pixels of FIGS. 20A and 20B are driven by the same driving method as the pixel of FIG. 18, and therefore, a detailed description of the driving method will be omitted.

Referring to FIGS. 20A and 20B, each of the pixels PXL' according to these other exemplary embodiments of the inventive concept includes an organic light emitting diode OLED and a pixel circuit PC' for controlling the amount of current supplied to the organic light emitting diode OLED.

An anode electrode of the organic light emitting diode OLED is coupled to the pixel circuit PC', and a cathode electrode of the organic light emitting diode OLED is coupled to the second driving power source ELVSS. The organic light emitting diode OLED generates light with a predetermined luminance corresponding to the amount of current supplied from the pixel circuit PC' during the light emission period.

During the light emission period, the pixel circuit PC' controls the amount of current flowing from the first driving power source ELVDD to the second driving power source ELVSS via the organic light emitting diode OLED, corresponding to the data signal.

Referring to FIG. 20A, the pixel circuit PC' includes a first transistor M1, a second transistor M2, a third transistor M3", and a fourth transistor M4(P).

The fourth transistor M4(P) is coupled between the initialization power source Vint and the anode electrode of the organic light emitting diode OLED. In addition, a gate electrode of the fourth transistor M4(P) is coupled to a first control line CL1. The fourth transistor M4(P) is turned on when the first control signal is supplied to the first control line CL1. If the fourth transistor M4(P) is turned on, the first voltage V1 of the initialization power source Vint is supplied to the anode electrode of the organic light emitting diode OLED.

In FIG. 20A, the other components and operating process of the pixel PXL' are set identically to those of FIG. 18, except that the fourth transistor M4(P) is formed as a P-type transistor. However, when the fourth transistor M4(P) is formed as the P-type transistor, the polarity of the first control signal supplied to the first control line is reversed. That is, the first control signal may be set to a low voltage to have the gate-on voltage.

Referring to FIG. 20B, the pixel circuit PC' includes a first transistor M1, a second transistor M2(P), a third transistor M3"(P), and a fourth transistor M4(P).

The second transistor M2(P) is coupled between the first node N1 and the second node N2. In addition, a gate electrode of the second transistor M2(P) is coupled to the ith scan line Si. The second transistor M2(P) is turned on when the scan signal is supplied to the ith scan line Si to allow the first node N1 and the second node N2 to be electrically coupled to each other.

The third transistor M3"(P) is coupled between the second node N2 and the anode electrode of the organic light emitting diode OLED. In addition, a gate electrode of the third transistor M3"(P) is coupled to the ith scan line Si. The third transistor M3"(P) is turned on when the scan signal is supplied to the ith scan line Si to allow the second node N2 and the anode electrode of the organic light emitting diode OLED to be electrically coupled to each other.

The fourth transistor M4(P) is coupled between the initialization power source Vint and the anode electrode of the organic light emitting diode OLED. In addition, a gate electrode of the fourth transistor M4(P) is coupled to the first control line CL1. The fourth transistor M4(P) is turned on when the first control signal is supplied to the first control line CL1. If the fourth transistor M4(P) is turned on, the first voltage V1 of the initialization power source Vint is supplied to the anode electrode of the organic light emitting diode OLED.

In FIG. 20B, the other components and operating process of the pixel PXL' are set identically to those of FIG. 13, except that the second transistor M2(P), the third transistor M3"(P), and the fourth transistor M4(P) are formed as P-type transistors. However, when the second transistor M2(P) and the third transistor M3"(P) are formed as the P-type transistors, the polarity of the scan signal is reversed. That is, the scan signal may be set to a low voltage to have the gate-on voltage.

Similarly, when the fourth transistor M4(P) is formed as the P-type transistor, the polarity of the first control signal supplied to the first control line CL1 is reversed. That is, the first control signal may be set to a low voltage to have the gate-on voltage.

In the above-described FIG. 18, it has been illustrated that the transistors M1, M2, M3", and M4 are formed as N-type transistors. Here, at least one of the transistors M1, M2, M3", and M4 may be formed as an oxide semiconductor transistor. In addition, at least one of the transistors M1, M2, M3", and M4 may be formed as a poly-silicon semiconductor transistor.

Figure 21A:
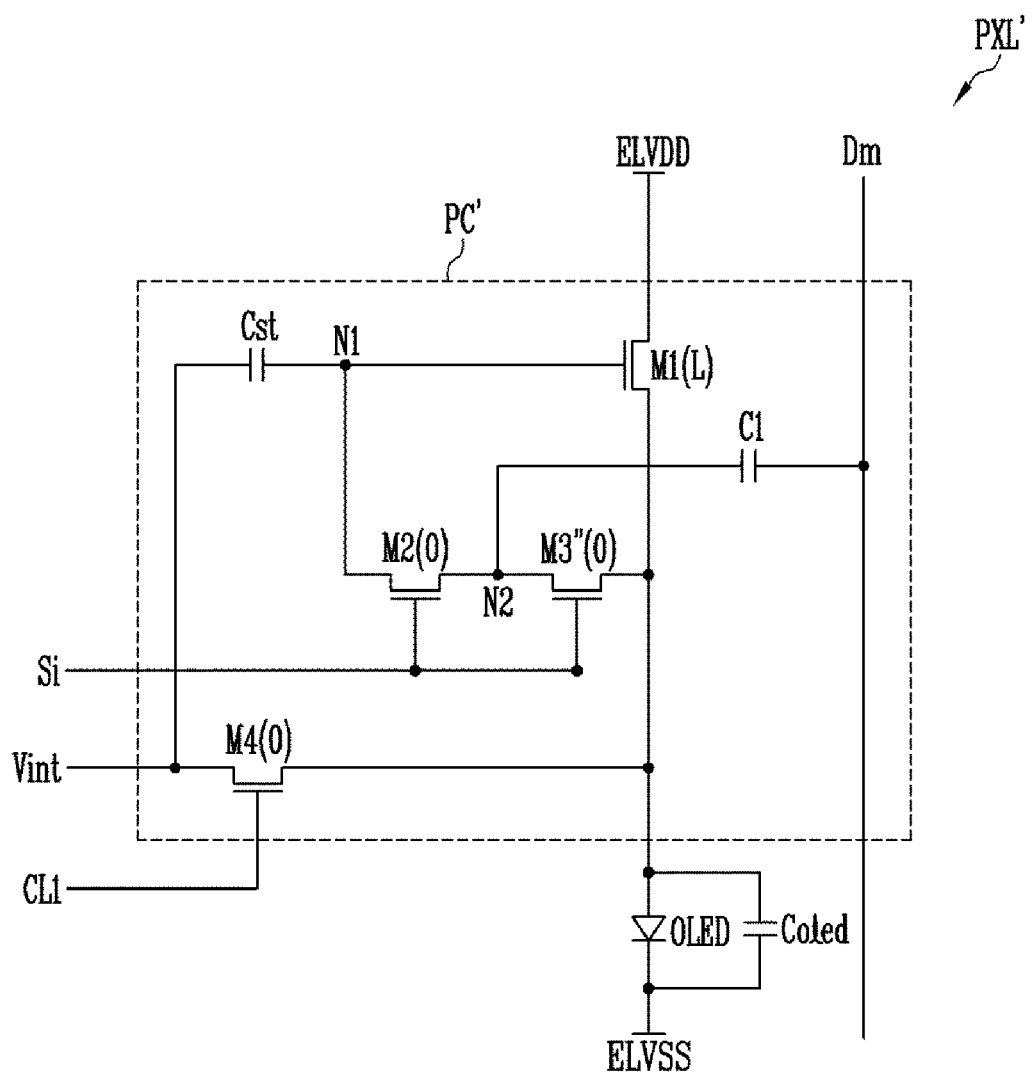
FIG. 21A, FIG. 21B, and FIG. 21C are diagrams illustrating still other exemplary embodiments of the pixel shown in FIG. 13.
Figure 21B:
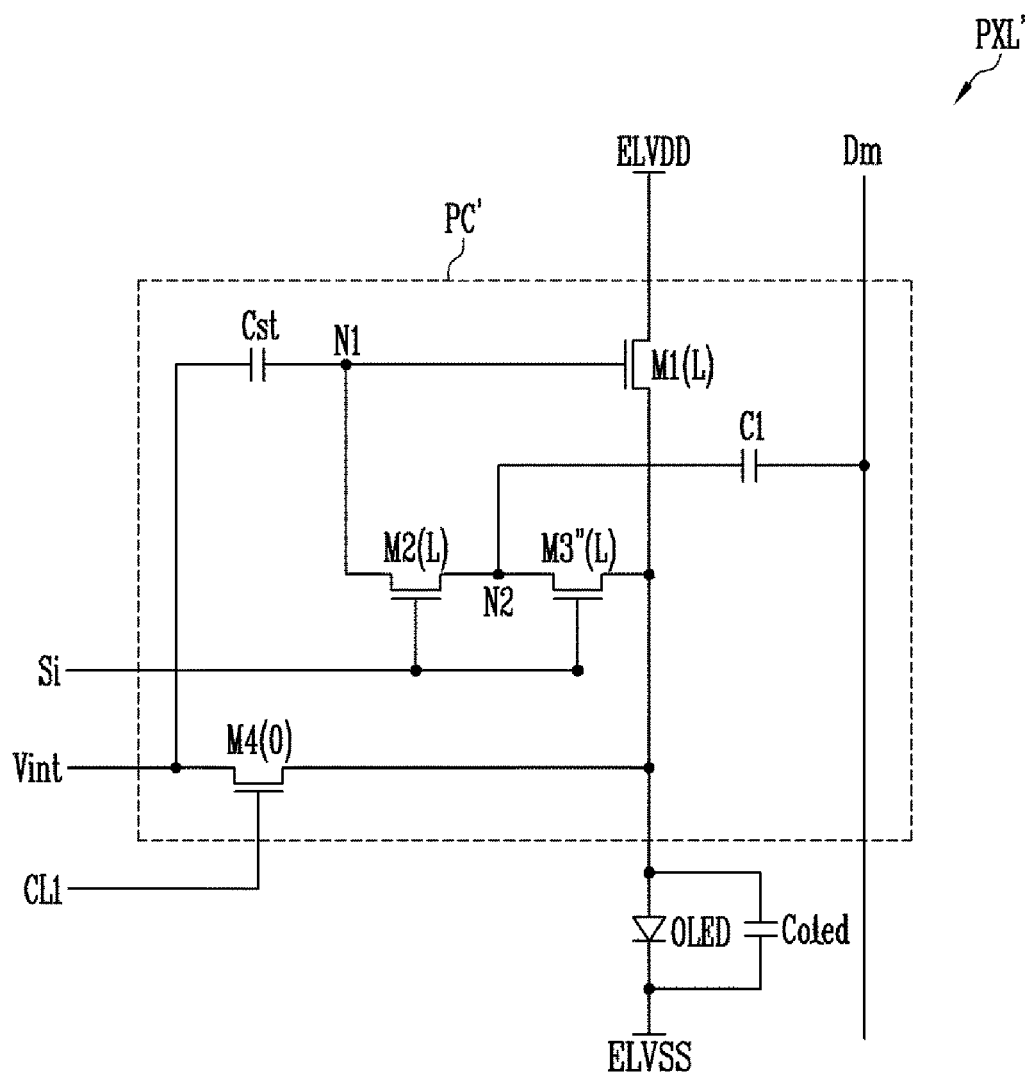
Figure 21C:
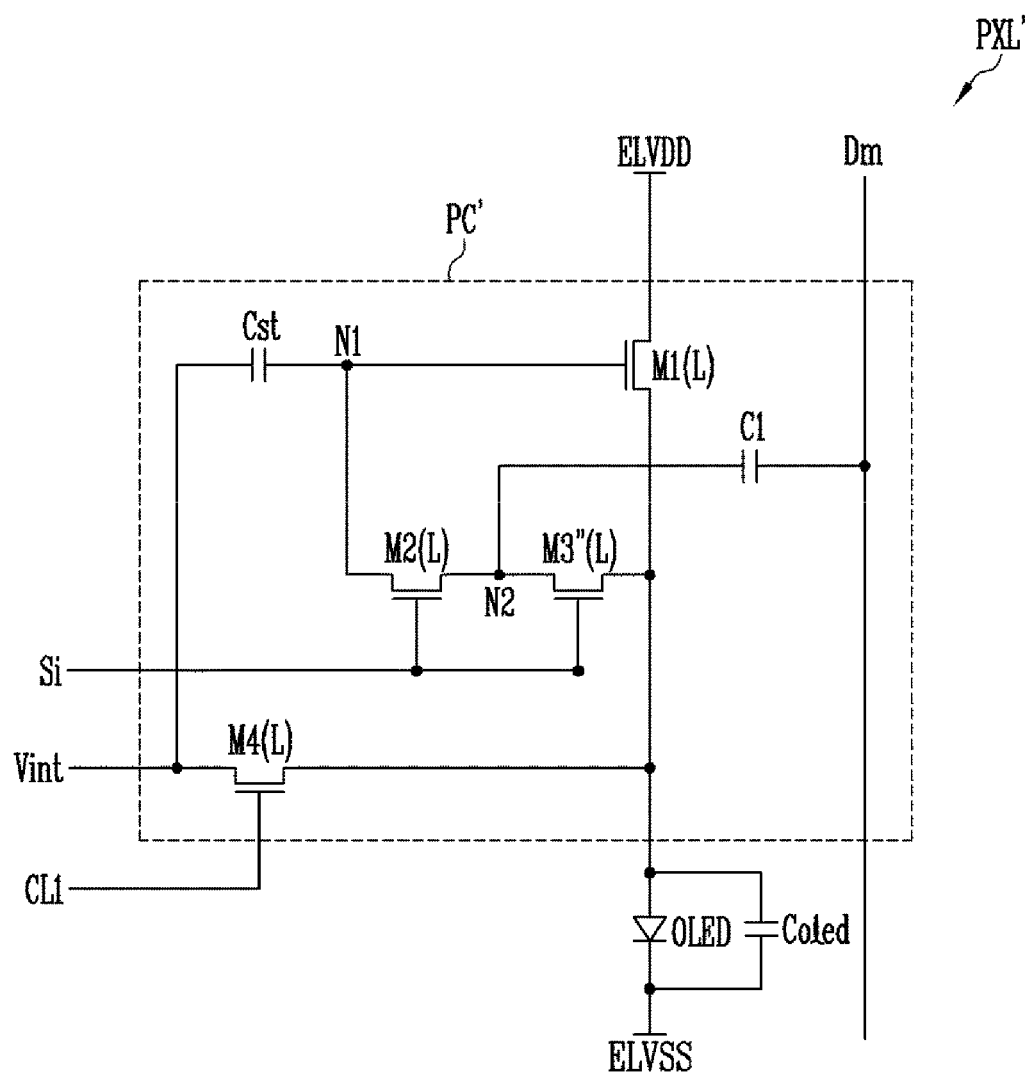

FIGS. 21A to 21C are diagrams illustrating still other exemplary embodiments of the pixel shown in FIG. 13. The pixels of FIGS. 21A to 21C are driven by the same driving method as the pixel of FIG. 13, and therefore, a detailed description of the driving method will be omitted.

Referring to FIGS. 21A to 21C, each of the pixels PXL' according to the other exemplary embodiments of the inventive concept includes an organic light emitting diode OLED and a pixel circuit PC' for controlling the amount of current supplied to the organic light emitting diode OLED.

An anode electrode of the organic light emitting diode OLED is coupled to the pixel circuit PC', and a cathode electrode of the organic light emitting diode OLED is coupled to the second driving power source ELVSS. The organic light emitting diode OLED generates light with a predetermined luminance corresponding to the amount of current supplied from the pixel circuit PC' during the light emission period.

During the light emission period, the pixel circuit PC' controls the amount of current flowing from the first driving power source ELVDD to the second driving power source ELVSS via the organic light emitting diode OLED, corresponding to the data signal. To this end, the pixel circuit PC' includes four transistors.

Referring to FIG. 21A, a first transistor M1(L) may be formed as a poly-silicon semiconductor transistor, and a second transistor M2(O), a third transistor M3"(O), and a fourth transistor M4(O) may be formed as oxide semiconductor transistors.

Referring to FIG. 21B, a first transistor M1(L), a second transistor M2(L), and a third transistor M3"(L) may be formed as poly-silicon semiconductor transistors, and a fourth transistor M4(O) may be formed as an oxide semiconductor transistor.

Referring to FIG. 21C, a first transistor M1(L), a second transistor M2(L), a third transistor M3"(L), and a fourth transistor M4(L) may be formed as poly-silicon semiconductor transistors.

Figure 22:
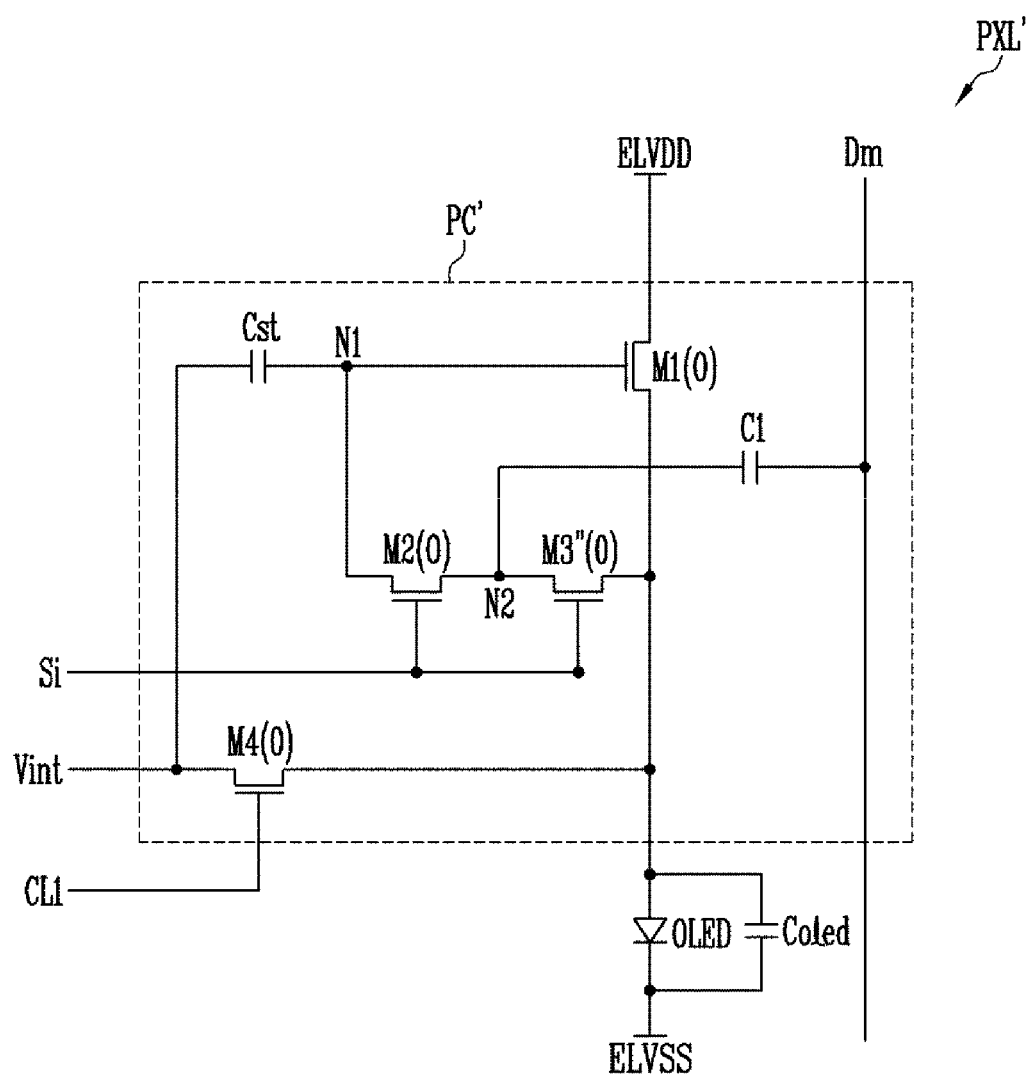
FIG. 22 is a diagram illustrating still another exemplary embodiment of the pixel shown in FIG. 13.

That is, in these other exemplary embodiments, at least one transistor among the first to fourth transistors M1 to M4 may be formed as a poly-silicon semiconductor transistor. Similarly, in these other exemplary embodiments, at least one transistor among the first to fourth transistors M1 to M4 may be formed as an oxide semiconductor transistor. For example, as shown in FIG. 22, first to fourth transistors M1(O), M2(O), M3"(O), and M4(O) may be formed as oxide semiconductor transistors.

A ratio of oxide semiconductor transistors and/or polysilicon semiconductor transistors, which are included in the pixel circuit PC', may be variously set by considering the resolution, size, etc. of a panel.

Figure 23:
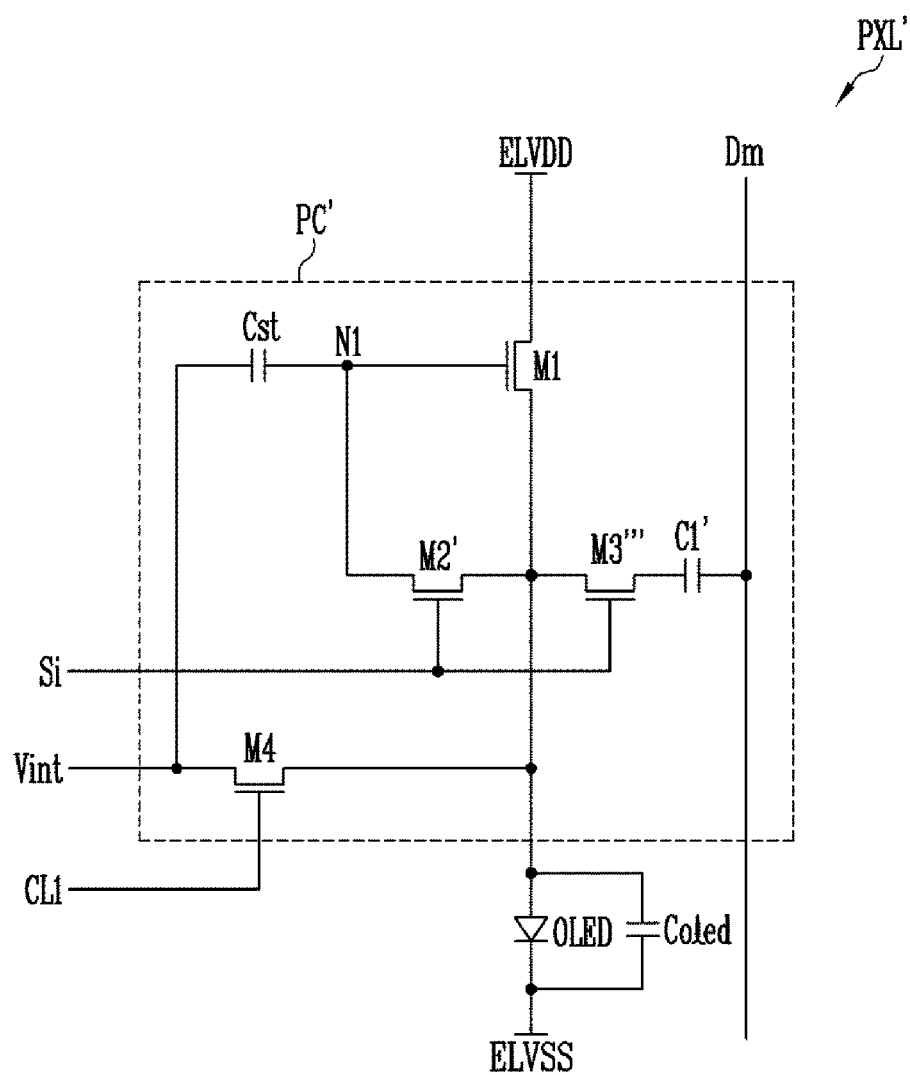
FIG. 23 is a diagram illustrating still another exemplary embodiment of the pixel shown in FIG. 13.

FIG. 23 is a diagram illustrating still another exemplary embodiment of the pixel shown in FIG. 13. In FIG. 23, components identical to those of FIG. 18 are designated by like reference numerals, and their detailed descriptions will be omitted.

Referring to FIG. 23, the pixel PXL' according to the exemplary embodiment of the inventive concept includes an organic light emitting diode OLED and a pixel circuit PC' for controlling the amount of current supplied to the organic light emitting diode OLED.

An anode electrode of the organic light emitting diode OLED is coupled to the pixel circuit PC', and a cathode electrode of the organic light emitting diode OLED is coupled to the second driving power source ELVSS. The organic light emitting diode OLED generates light with a predetermined luminance corresponding to the amount of current supplied from the pixel circuit PC' during the light emission period.

During the light emission period, the pixel circuit PC' controls the amount of current flowing from the first driving power source ELVDD to the second driving power source ELVSS via the organic light emitting diode OLED, corresponding to the data signal. To this end, the pixel circuit PC' includes first to fourth transistors M1, M2', M3''', and M4, a storage capacitor Cst, and a first capacitor C1'.

The second transistor M2' is coupled between the first node N1 and the anode electrode of the organic light emitting diode OLED. In addition, a gate electrode of the second transistor M2' is coupled to the ith scan line Si. The second transistor M2' is turned on when the scan signal is supplied to the ith scan line Si to allow the first node N1 and the anode electrode of the organic light emitting diode OLED to be electrically coupled to each other.

The third transistor M3''' is coupled between the anode electrode of the organic light emitting diode OLED and a first terminal of the first capacitor C In addition, a gate electrode of the third transistor M''' is coupled to the first scan line Si. The third transistor M''' is turned on when the scan signal is supplied to the ith scan line Si to allow the anode electrode of the organic light emitting diode OLED and the first terminal of the first capacitor C1' to be electrically couple to each other.

The first terminal of the first capacitor C1' is coupled to the third transistor M3''', and a second terminal of the first capacitor C1' is coupled to the data line Dm.

An operating process of the pixel PXL' will be described in conjunction with FIGS. 19 and 23. First, the scan signal is supplied to all of the scan lines S during the initialization period. In addition, the first control signal is supplied to the first control line CL1 during the initialization period.

If the first control signal is supplied to the first control line CL1, the fourth transistor M4 included in each of the pixels PXL' is turned on. If the fourth transistor M4 is turned on, the first voltage V1 of the initialization power source Vint is supplied to the anode electrode of the organic light emitting diode OLED.

If the scan signal is supplied to the scan lines S, the second transistor MT and the third transistor M3'', which are included in each of the pixels PXL', are turned on. If the second transistor MT is turned on the first node N1 and the anode electrode of the organic light emitting diode OLED are electrically coupled to each other. Then, the first voltage V1 of the initialization power source Vint is supplied to the first node N1. That is, during the initialization period, the anode electrode of the organic light emitting diode OLED and the first node N1, which are included in each of the pixels PXL', are initialized to the first voltage V1 of the initialization power source Vint.

The supply of the first control signal to the first control line CL1 is stopped during the threshold voltage compensation period. If the supply of the first control signal to the first control line CL1 is stopped, the fourth transistor M4 is turned off. In addition, the first driving power source ELVDD is set to a third voltage V3 during the threshold voltage compensation period.

The scan signal is supplied to the scan lines S during the threshold voltage compensation period, and accordingly, the second transistor MT and the third transistor M3'', which are included in each of the pixels PXL', maintain the turn-on state. If the second transistor MT is turned on, the first transistor M1 is diode-coupled such that current can flow from the anode electrode of the organic light emitting diode OLED to the first driving power source ELVDD. Then, the current is supplied from the first node N1 and the anode electrode of the organic light emitting diode OLED, which are set to the first voltage V1, to the first driving power source ELVDD set to the third voltage V3.

At this time, since the first transistor M1 is diode-coupled, as described above, the voltage of the first node N1 is set to a voltage obtained by adding an absolute value of the threshold voltage of the first transistor M1 to the third voltage V3 of the first driving power source ELVDD. That is, the voltage corresponding to the threshold voltage of the first transistor M1 is applied to the first node N1 during the threshold voltage compensation period. The voltage corresponding to the threshold voltage of the first transistor M1, which is applied to the first node N1, is stored in the storage capacitor Cst during the threshold voltage compensation period.

The scan signal is simultaneously supplied to all of the scan lines S during the initialization period and the threshold voltage compensation period. Therefore, the voltage corresponding to the threshold voltage of the first transistor M1 coupled to the storage capacitor Cst included in each of the pixels PXL' is stored in the storage capacitor Cst during the initialization period and the threshold voltage compensation period.

If the third transistor M3''' is turned on, the anode electrode of the organic light emitting diode OLED and the first terminal of the first capacitor C1' are electrically coupled to each other. At this time, a constant voltage is supplied to the data line Dm, and has no influence on the voltage of the first node N1.

The scan signal is sequentially supplied to the scan lines S during the programming period. In addition, the first driving power source ELVDD is set to a fourth voltage V4 higher than the third voltage V3.

If the scan signal is supplied to the ith scan line Si, the second transistor M2' and the third transistor M3''', which are coupled to the ith scan line Si, are turned on. If the second transistor M2' is turned on, the first node N1 and the second node N2 are electrically coupled to each other. If the third transistor M3''' is turned on, the first terminal of the first capacitor C1' and the anode electrode of the organic light emitting diode OLED are electrically coupled to each other.

The data signal is supplied to the data line Dm to be synchronized with the ith scan line Si. If the data signal is supplied to the data line Dm, voltages of the second node N2 and the first node N1 are changed by coupling of the first capacitor C1'. That is, if the second transistor M2' and the third transistor M3''' are turned on, the voltage of the first node N1 is set corresponding to the voltage of the data signal. Therefore, during the programming period, the voltages corresponding to the threshold voltage of the first transistor M1 and the data signal are stored in the storage capacitor Cst included in each of the pixels PXL'.

In other words, the scan signal is sequentially supplied to the scan lines S during the programming period. Then, the second transistors M2' and the third transistors M3''', which are included in the respective pixels PXL', are turned on in units of horizontal lines, and accordingly, a voltage corresponding to a desired data signal can be stored in each of the pixels PXL'.

The initialization power source Vint is set to a second voltage V2 during the light emission Vint. If the initialization power source Vint is set to the second voltage V2, i.e., if the initialization power source Vint is increased from the first voltage V1 to the second voltage V2, the voltage of the first node N1 is increased by coupling of the storage capacitor Cst. At this time, the first transistor M1 controls the amount of current flowing from the first driving power source ELVDD set to a fourth voltage V4 to the second driving power source ELVDD via the organic light emitting diode OLED, corresponding to the voltage of the first node N1.

As described above, each of the pixels PXL' according to the exemplary embodiment of the inventive concept generates light with a predetermined luminance by passing through the initialization period, the threshold voltage compensation period, the programming period, and the light emission period during the one frame period 1F.

In an exemplary embodiment of the inventive concept, the first capacitor C1' is coupled between the data line Dm and the third transistor M3''', and accordingly, an image with uniform luminance can be displayed from the pixel unit 100'. That is, a voltage of an organic capacitor Coled is not changed corresponding to a change in voltage of the data line Dm, and accordingly, an image with uniform luminance can be displayed.

At least one of the second transistor M2', the third transistor M3''', and the fourth transistor M4, which are shown in FIG. 23, may be formed as a P-type transistor (e.g., a PMOS transistor). In addition, the first transistor M1, the second transistor M2', the third transistor M3''', and the fourth transistor M4, which are shown in FIG. 23, may be formed as oxide semiconductor transistors and/or poly-silicon semiconductor transistors.

In the pixel and the organic light emitting display device using the same according to the inventive concept, three transistors are included in the pixel, and accordingly, the pixel can be applied to a high-resolution panel. Further, in the inventive concept, the capacitor coupled to the data line is not directly coupled to the anode electrode of the organic light emitting diode, and accordingly, it is possible to prevent a voltage of the anode electrode of the organic light emitting diode from being changed corresponding to a change in voltage of the data line. If the voltage of the anode electrode of the organic light emitting diode is not changed corresponding to the change in voltage of the data line, a leakage current, etc. is approximately equally set in the pixels, and hence, images with uniform luminance can be displayed.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular exemplary embodiment may be used singly or in combination with features, characteristics, and/or elements described in connection with other exemplary embodiments unless otherwise specifically indicated. Accordingly, the inventive concept is not limited to such exemplary embodiments, but rather to the broader scope of the presented claims and various obvious modifications and equivalent arrangements.

What is claimed is:

1. A pixel comprising:
an organic light emitting diode;
a first transistor configured to control the amount of current flowing from a first driving power source to a second driving power source via the organic light emitting diode, corresponding to a voltage of a first node;
a second transistor coupled between the first node and a second node, the second transistor configured to be turned on in response to a scan signal being supplied to an ith (i is a natural number) scan line;
a third transistor coupled between the second node and an anode electrode of the organic light emitting diode;
a first capacitor coupled between a data line and the second node; and
a fourth transistor coupled between an initialization power source and the anode electrode of the organic light emitting diode, the fourth transistor configured to be turned on in response to a first control signal being supplied to a first control line.

2. The pixel of claim 1, further comprising a storage capacitor coupled between the first node and the initialization power source.

3. The pixel of claim 1, wherein a turn-on period of the fourth transistor at least partially overlaps with that of the second transistor.

4. The pixel of claim 1, wherein the third transistor is configured to be turned on in response to a second control signal being supplied to a second control line, and a turn-on period of the third transistor at least partially overlaps with that of the second transistor.

5. The pixel of claim 1, wherein the third transistor is configured to be turned on in response to a scan signal being supplied to an (i+1)th scan line.

6. The pixel of claim 1, wherein the third transistor is configured to be turned on in response to the scan signal being supplied to the ith scan line.

7. The pixel of claim 1, wherein the first transistor is an N-type transistor.

8. The pixel of claim 7, wherein the second to fourth transistors are N-type transistors.

9. The pixel of claim 8, wherein at least one of the first to fourth transistors is a poly-silicon semiconductor transistor.

10. The pixel of claim 8, wherein at least one of the first to fourth transistors is an oxide semiconductor transistor.

11. The pixel of claim 7, wherein at least one of the second to fourth transistors is a P-type transistor.

12. A pixel comprising:
an organic light emitting diode;
a first transistor configured to control the amount of current flowing from a first driving power source to a second driving power source via the organic light emitting diode, corresponding to a voltage of a first node;
a second transistor coupled between the first node and an anode electrode of the organic light emitting diode, the second transistor configured to be turned on in response to a scan signal being supplied to an ith scan line;
a third transistor coupled between the anode electrode of the organic light emitting diode and a first terminal of a first capacitor, the third transistor configured to be turned on in response to the scan signal being supplied to the ith scan line, the first capacitor coupled between the third transistor and a data line; and
a fourth transistor coupled between an initialization power source and the anode electrode of the organic light emitting diode, the fourth transistor configured to be turned on in response to a first control signal being supplied to a first control line.

13. The pixel of claim 12, further comprising a storage capacitor coupled between the first node and the initialization power source.

14. The pixel of claim 12, wherein a turn-on period of the fourth transistor at least partially overlaps with that of the second transistor.

15. An organic light emitting display device configured to be driven during one frame period divided into an initialization period, a threshold voltage compensation period, a programming period, and a light emission period, the organic light emitting display device comprising:
pixels coupled to scan lines and data lines;
a scan driver configured to supply a scan signal to the scan lines;
a control driver configured to supply a first control signal to a first control line commonly coupled to the pixels; and
a power supply unit configured to supply, to the pixels, a first driving power source, a second driving power source, and an initialization power source,
wherein a pixel located on an ith (i is a natural number) horizontal line comprises:
an organic light emitting diode;
a first transistor configured to control the amount of current flowing from the first driving power source to the second driving power source via the organic light emitting diode, corresponding to a voltage of a first node;
a second transistor coupled between the first node and a second node, the second transistor configured to be turned on in response to a scan signal being supplied to an ith scan line;
a third transistor coupled between the second node and an anode electrode of the organic light emitting diode;
a first capacitor coupled between a data line and the second node; and
a fourth transistor coupled between the initialization power source and the anode electrode of the organic light emitting diode, the fourth transistor configured to be turned on in response to the first control signal being supplied to the first control line.

16. The organic light emitting display device of claim 15, wherein the control driver is configured to supply the first control signal during the initialization period.

17. The organic light emitting display device of claim 15, wherein the scan driver is configured to simultaneously supply the scan signal to the scan lines during the initialization period and the threshold voltage compensation period, and sequentially supply the scan signal to the scan lines during the programming period.

18. The organic light emitting display device of claim 15, wherein the power supply unit is configured to supply the initialization power source having a first voltage during the initialization period, the threshold voltage compensation period, and the programming period, and supply the initialization power source having a second voltage higher than the first voltage during the light emission period.

19. The organic light emitting display device of claim 18, wherein the first voltage is set to a level such that the organic light emitting diode does not emit light.

20. The organic light emitting display device of claim 18, wherein the power supply unit is configured to supply the first driving power source having a third voltage during the threshold voltage compensation period, and supply the first driving power source having a fourth voltage higher than the third voltage during the other periods.

21. The organic light emitting display device of claim 20, wherein the first voltage is set to a voltage higher than the third voltage.

22. The organic light emitting display device of claim 15, wherein the pixel located on the ith horizontal line further comprises a storage capacitor coupled between the first node and the initialization power source.

23. The organic light emitting display device of claim 15, further comprising a second control line commonly coupled to the pixels,
wherein the control driver is configured to supply a second control signal to the second control line during the initialization period and the threshold voltage compensation period.

24. The organic light emitting display device of claim 23, wherein the third transistor is configured to be turned on in response to the second control signal being supplied thereto.

25. The organic light emitting display device of claim 15, wherein the third transistor is configured to be turned on in response to a scan signal being supplied to an (i+1)th scan line.

26. The organic light emitting display device of claim 15, wherein the third transistor is configured to be turned on in response to the scan signal being supplied to the ith scan line.

27. The organic light emitting display device of claim 15, wherein the first transistor is an N-type transistor.

28. The organic light emitting display device of claim 27, wherein the second to fourth transistors are N-type transistors.

29. The organic light emitting display device of claim 28, wherein at least one of the first to fourth transistors is a poly-silicon semiconductor transistor.

30. The organic light emitting display device of claim 28, wherein at least one of the first to fourth transistors is an oxide semiconductor transistor.

31. The organic light emitting display device of claim 27, wherein at least one of the second to fourth transistors is a P-type transistor.

* * * * *